(12) United States Patent  
Yamazaki et al.

(10) Patent No.: US 7,859,187 B2  
(45) Date of Patent: Dec. 28, 2010

(54) DISPLAY DEVICE AND METHOD FOR FABRICATING THE SAME

(75) Inventors: Shunpei Yamazaki, Tokyo (JP); Shinji Maekawa, Shizuoka (JP); Gen Fujii, Kanagawa (JP); Hideaki Kuwabara, Kanagawa (JP); Yuko Tachimura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 1106 days.

(21) Appl. No.: 10/576,495

(22) PCT Filed: Nov. 5, 2004

(86) PCT No.: PCT/JP2004/016814

§ 371 (c)(1),  
(2), (4) Date: Apr. 20, 2006

(87) PCT Pub. No.: WO2005/048221

PCT Pub. Date: May 26, 2005

(65) Prior Publication Data

US 2007/0120471 A1     May 31, 2007

(30) Foreign Application Priority Data

Nov. 14, 2003   (JP) .............................. 2003-386020

(51) Int. Cl.  
*H01J 1/62* (2006.01)  
*H01J 9/24* (2006.01)

(52) U.S. Cl. .................... 313/506; 313/509; 445/24

(58) Field of Classification Search ......... 313/498–512; 445/24  
See application file for complete search history.

(56) References Cited

U.S. PATENT DOCUMENTS

| 5,084,905 A | 1/1992 | Sasaki et al. |
| 5,747,930 A | 5/1998 | Utsugi |
| 6,072,450 A | 6/2000 | Yamada et al. |

(Continued)

FOREIGN PATENT DOCUMENTS

EP         0 684 753 A1      11/1995

(Continued)

OTHER PUBLICATIONS

International Search Report for (PCT/JP2004/016795) dated Feb. 15, 2005.

(Continued)

*Primary Examiner*—Bumsuk Won  
(74) *Attorney, Agent, or Firm*—Nixon Peabody LLP; Jeffrey L. Costellia

(57) ABSTRACT

It is an object of the invention to provide a display device which can be manufactured by a simplified manufacturing process by which the efficiency in the use of material is improved. It is a further object of the invention to provide a manufacturing method of the display device. It is another object of the invention to provide a fabrication technology for improving adhesion of a pattern. In view of the above problems, according to the present invention, a pattern is formed by a droplet discharge method. Particularly in the invention, base pretreatment is performed before/after a pattern is formed by a droplet discharge method. As a result of such base pretreatment, adhesion of a pattern can improved, and the pattern may be made finer.

47 Claims, 26 Drawing Sheets

U.S. PATENT DOCUMENTS

| | | | |
|---|---|---|---|
| 6,346,730 B1 | 2/2002 | Kitakado et al. | |
| 6,614,053 B1 | 9/2003 | Takenaka | |
| 6,639,265 B2 | 10/2003 | Arao et al. | |
| 6,709,902 B2 | 3/2004 | Kitakado et al. | |
| 6,767,772 B2 | 7/2004 | Takenaka | |
| 6,994,414 B2 | 2/2006 | Hashimoto et al. | |
| 7,119,365 B2 | 10/2006 | Takafuji et al. | |
| 7,136,127 B2 | 11/2006 | Furusawa | |
| 7,176,068 B2 | 2/2007 | Kitakado et al. | |
| 7,198,816 B2 | 4/2007 | Masuda et al. | |
| 7,619,250 B2 | 11/2009 | Takafuji et al. | |
| 7,638,846 B2 | 12/2009 | Kitakado et al. | |
| 2001/0044259 A1* | 11/2001 | Akedo | 451/38 |
| 2002/0006558 A1 | 1/2002 | Kobayashi et al. | |
| 2002/0056838 A1 | 5/2002 | Ogawa | |
| 2002/0104995 A1* | 8/2002 | Yamazaki et al. | 257/72 |
| 2003/0059717 A1* | 3/2003 | Tabuchi et al. | 430/302 |
| 2003/0127974 A1* | 7/2003 | Miyazawa | 313/504 |
| 2003/0165714 A1* | 9/2003 | Lee et al. | 428/690 |
| 2003/0168966 A1* | 9/2003 | Kobayashi et al. | 313/495 |
| 2003/0210361 A1* | 11/2003 | Kiguchi et al. | 349/106 |
| 2004/0005739 A1 | 1/2004 | Furusawa | |
| 2004/0065345 A1* | 4/2004 | Kobayashi | 134/1.3 |
| 2004/0160167 A1* | 8/2004 | Arai et al. | 313/500 |
| 2004/0216324 A1* | 11/2004 | Nakamura et al. | 34/235 |
| 2005/0026423 A1 | 2/2005 | Yamazaki | |
| 2005/0037614 A1 | 2/2005 | Fukuchi | |
| 2005/0088106 A1* | 4/2005 | Suh | 315/169.3 |
| 2007/0069210 A1 | 3/2007 | Yamazaki et al. | |
| 2007/0146568 A1 | 6/2007 | Yamazaki et al. | |
| 2010/0019242 A1 | 1/2010 | Takafuji et al. | |
| 2010/0090223 A1 | 4/2010 | Kitakado et al. | |

FOREIGN PATENT DOCUMENTS

| | | |
|---|---|---|
| EP | 0 845 812 A2 | 6/1998 |
| EP | 1 209 748 A1 | 5/2002 |
| JP | 7-312290 | 11/1995 |
| JP | 10-161564 | 6/1998 |
| JP | 2000-259099 | 9/2000 |
| JP | 2000-269336 | 9/2000 |
| JP | 2001-068680 | 3/2001 |
| JP | 2001-281438 | 10/2001 |
| JP | 2003-50405 | 2/2003 |
| JP | 2003-58077 | 2/2003 |
| JP | 2003-133691 | 5/2003 |
| JP | 2003-243328 | 8/2003 |
| JP | 2003-257992 | 9/2003 |
| JP | 2003-282885 | 10/2003 |
| JP | 2003-315829 | 11/2003 |
| JP | 2003-318131 | 11/2003 |
| JP | 2003-318133 | 11/2003 |
| JP | 2003-318516 | 11/2003 |
| WO | WO 2005-047967 | 5/2005 |
| WO | WO 2005-048221 A1 | 5/2005 |
| WO | WO 2005-048223 A1 | 5/2005 |

OTHER PUBLICATIONS

Written Opinion of the International Searching Authority for (PCT/JP2004/016795) dated Feb. 15, 2005.

Corrected Version of the Written Opinion of the International Searching Authority for (PCT/JP2004/016814) dated Mar. 1, 2005.

International Search Report for (PCT/JP2004/016814) dated Mar. 1, 2005.

* cited by examiner

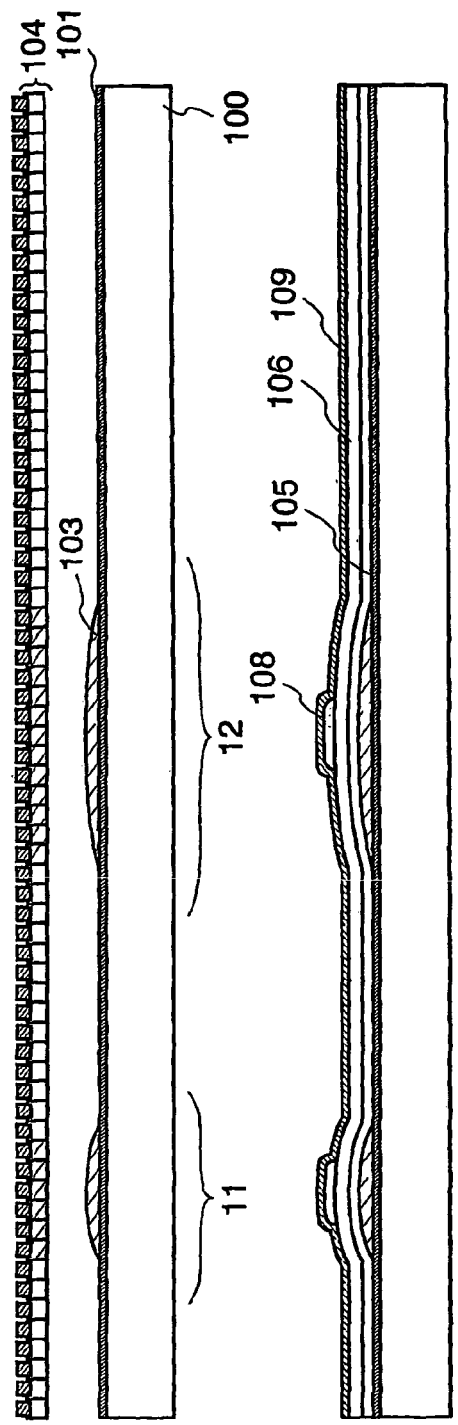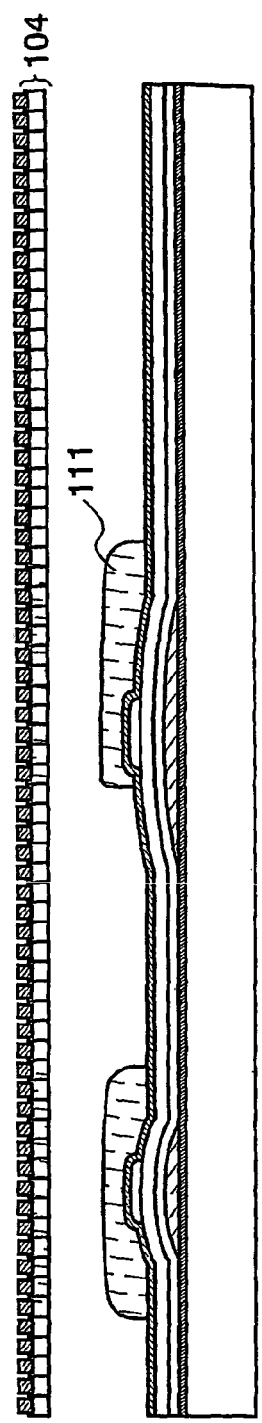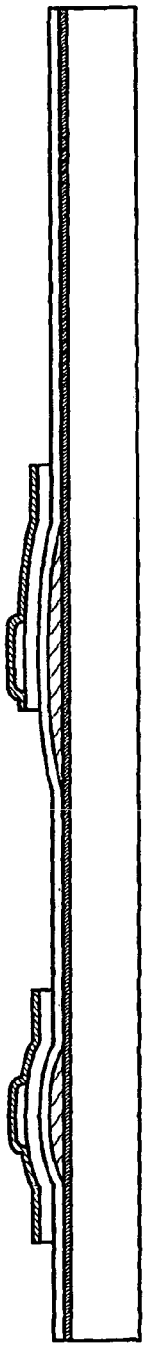

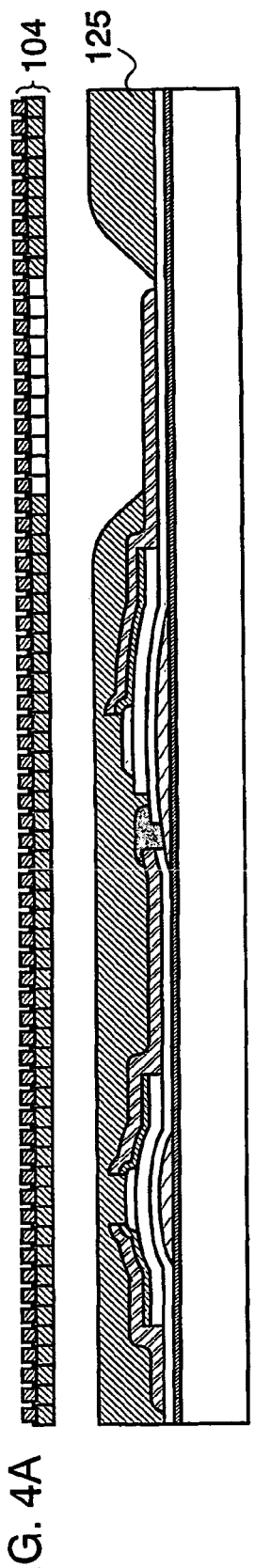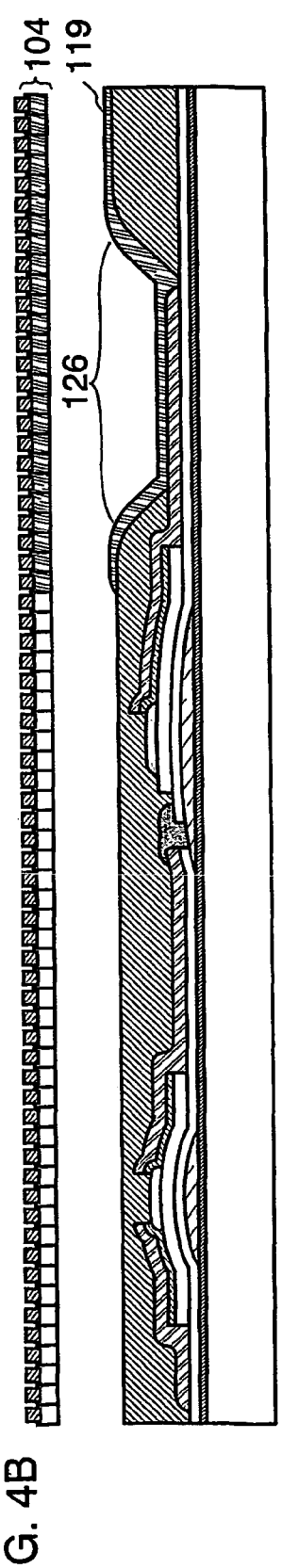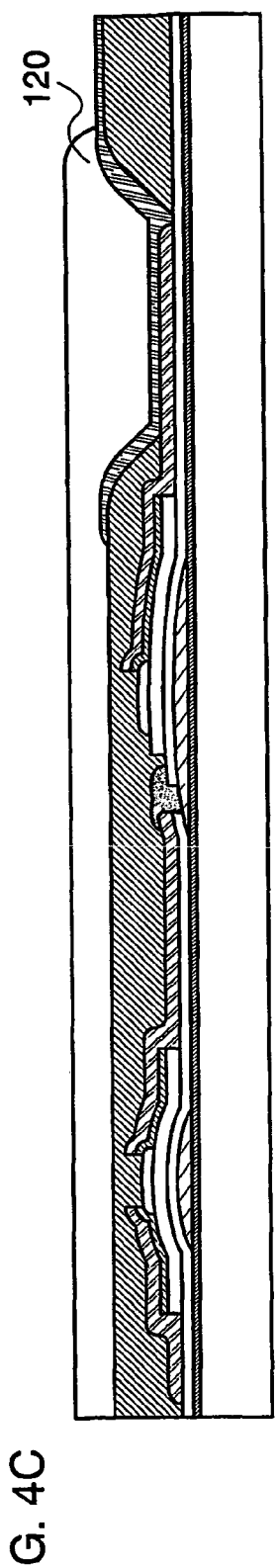
FIG. 4A
FIG. 4B
FIG. 4C

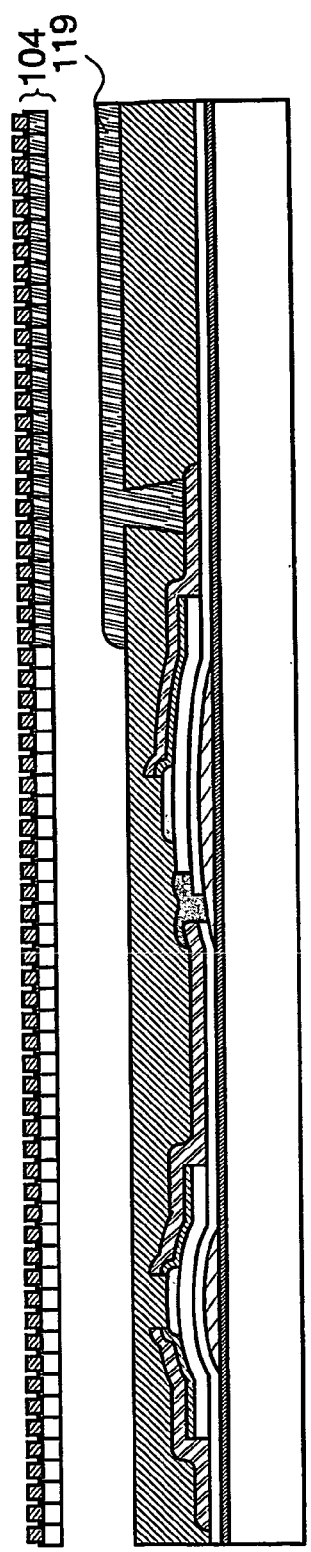
FIG. 5A
FIG. 5B
FIG. 5C

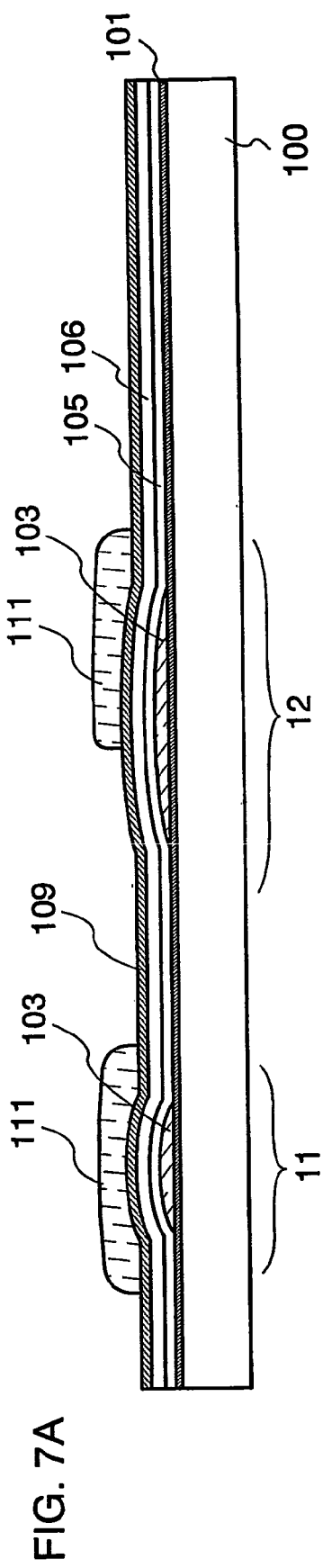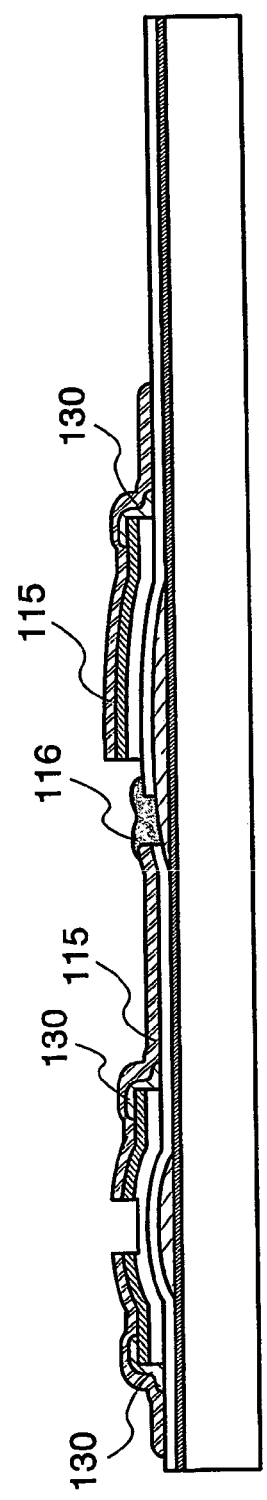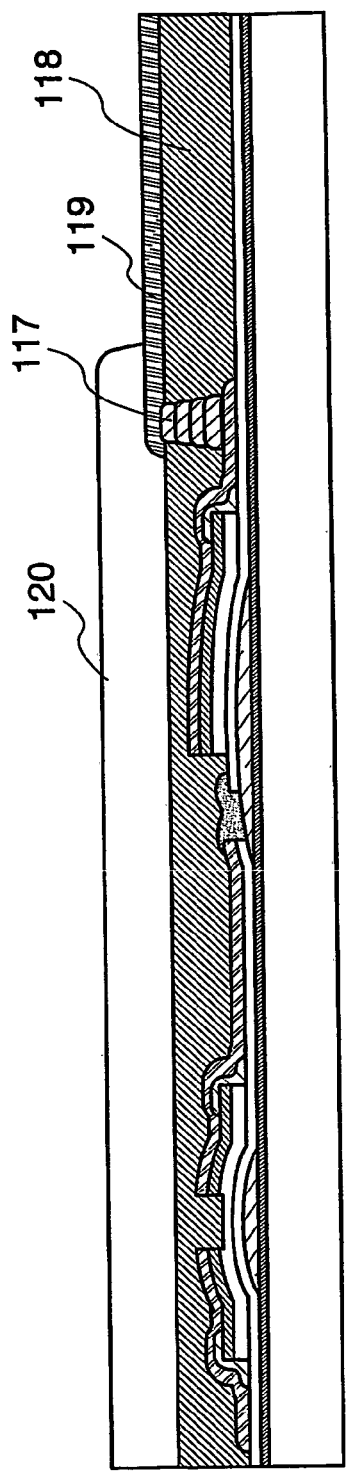
FIG. 7A
FIG. 7B
FIG. 7C

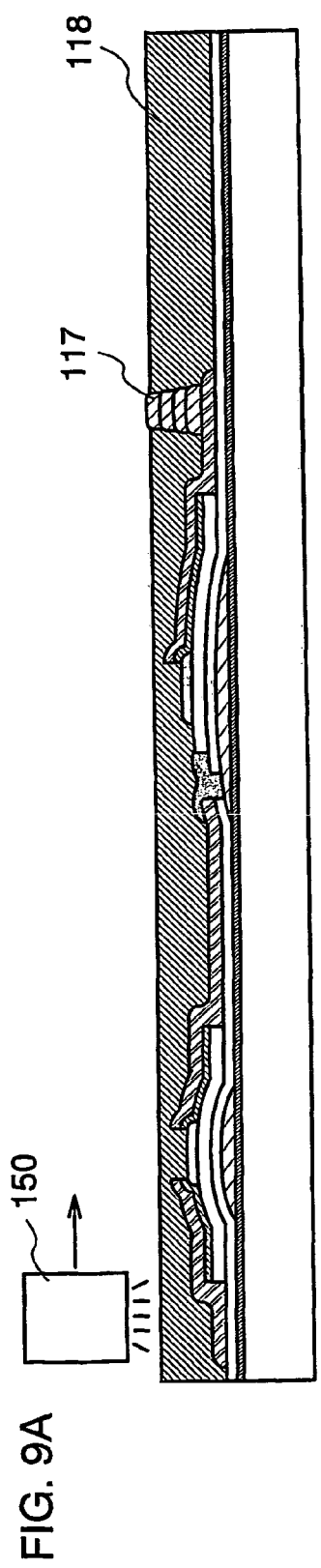
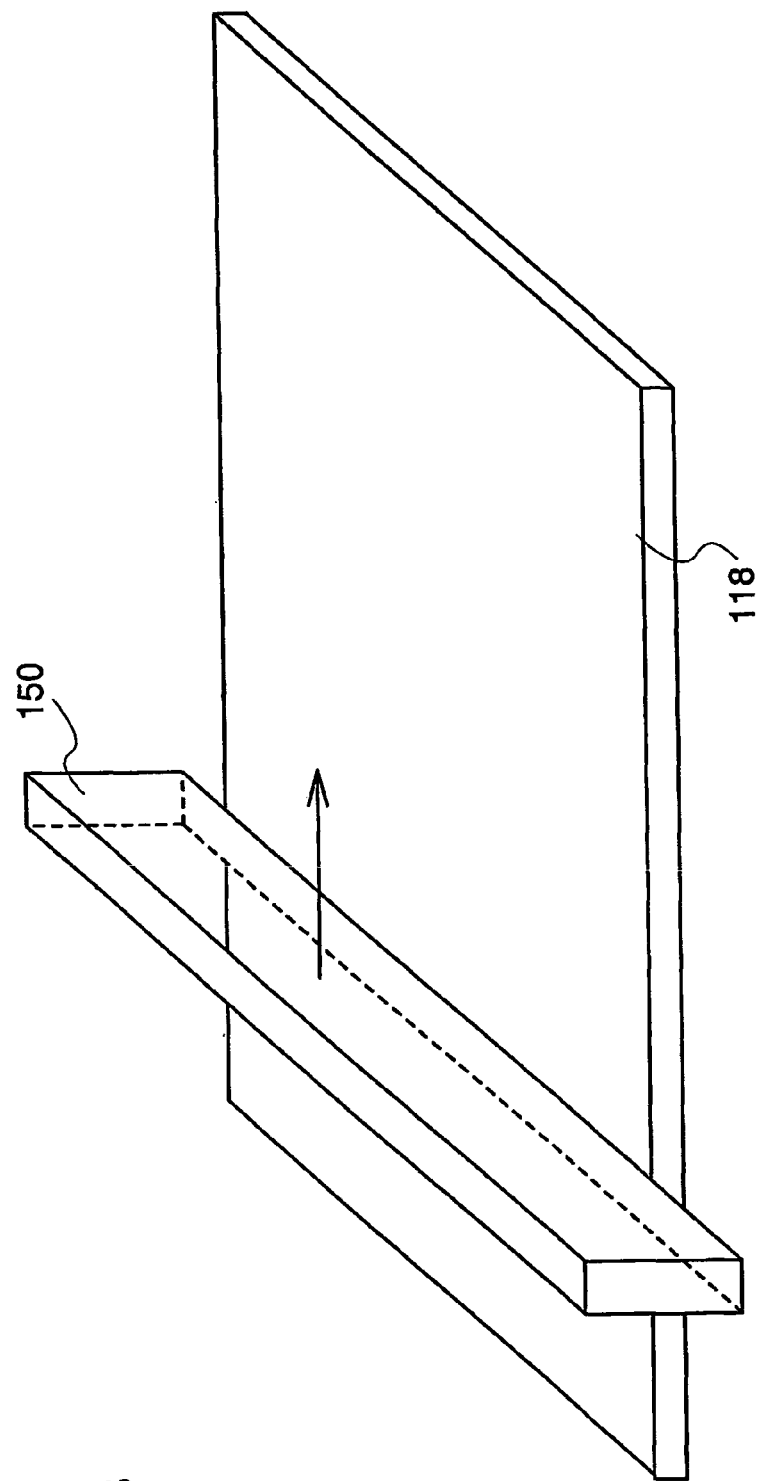

subject 2610

DISPLAY DEVICE AND METHOD FOR FABRICATING THE SAME

TECHNICAL FIELD

The present invention relates to a display device including an active element such as a transistor formed over a large glass substrate, and further relates to a method for fabricating such a display device.

BACKGROUND ART

A display panel including a thin film transistor (hereinafter also referred to as a TFT) over a glass substrate, that is an active matrix drive display panel, has been fabricated by patterning various thin films by means of a light exposure method using a photomask.

As to such a display panel, technologies for effective mass production by which a plurality of display panels can be obtained from one mother glass substrate have been employed. The size of a mother glass has become larger from 300 mm×400 mm of the first generation in the early 1990s to 680 mm×880 mm or 730 mm×920 mm of the fourth generation in 2000. Accordingly, production technology has been improved, so that multiple display panels can be obtained from one mother glass substrate.

In the case where the mother glass substrate is small, patterning has been able to be performed relatively easily with the use of a light exposure apparatus. However, mother glass substrates have become larger; therefore, the entire surfaces of the mother glass substrate cannot be treated by a single exposure. Consequently, such a method as the area where a photoresist is applied is divided into plural blocks; light exposure is performed to each block; thus, the entire surface of a substrate can be exposed by repeating the light exposure process, or other methods have been developed. (Reference: Japanese Patent Laid-Open No. 11-326951).

DISCLOSURE OF INVENTION

However, a mother glass substrate is further enlarged to a size of 1000 mm×1200 mm or 1100 mm×1300 mm in the fifth generation, and is further expected to have a size of 1500 mm×1800 mm or more in the next generation. Accordingly, it has become difficult to manufacture a display panel with good productivity at low cost by a conventional patterning method. Further, when a plurality of times of light-exposure is carried out as the above reference, the processing time is increased and huge investment is required to develop a light exposure apparatus which can handle such a larger substrate.

Moreover, in a method in which various types of films are formed over an entire surface of a substrate and the films are thereafter etched away leaving a small area, there is a problem that higher material costs are spent and a large amount of liquid waste is required to be processed.

It is an object of the invention to provide a display device which can be manufactured by a simplified manufacturing process by which the efficiency in the use of material is improved. It is a further object of the invention to provide a manufacturing method of the display device. It is another object of the invention to provide a fabrication technology for improving adhesion of a pattern.

In view of the above problems, according to the present invention, a pattern is formed by a method by which a pattern can be selectively formed. Particularly in the invention, it is preferable that a pattern may be formed by a method by which a pattern can be selectively formed, after base pretreatment.

Further, the base pretreatment may be performed after a pattern is formed by a method by which a pattern can be selectively formed. The base pretreatment can improve adhesion of a pattern.

A photocatalyst may be formed for base pretreatment. Further, a photocatalyst may be formed selectively in the area where a pattern is to be formed.

As another way of base pretreatment, a conductive film of Ti or the like may be formed by sputtering. Alternatively, Ti may be selectively applied over an area where a pattern is to be formed like a TiOx film. Further, oxidation treatment may be performed on Ti to form TiOx on the surface. In addition to TiOx, strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$) can also be used as a photocatalyst.

A photocatalyst denotes a material which has a photocatalytic function. The photocatalyst is activated when it is irradiated with light of an ultraviolet light region (wavelength: equal to or less than 400 nm, preferably, equal to or less than 380 nm). A fine pattern can be made by discharging a conductor contained in a solvent on the photocatalyst by ink-jet method.

As yet another way of base pretreatment, an organic film of such as a coupling agent or the like may be formed by coating or the like. A silane-based coupling agent and a fluorine-based coupling agent are given as the examples of the silane-based coupling agent. An organic film may be selectively formed in an area where a pattern is to be formed as with a TiOx film.

As a result of such base pretreatment, adhesion of a pattern can improved, and the pattern may be made finer.

As a method for selectively forming a pattern, a droplet discharge method (including ink-jet technology) by which droplets (dots) of a composition in which a material of a conductive film or an insulating film is mixed is selectively discharged may be employed.

As an ink-jet technology, a piezo system may be employed. The piezo system is also used in ink-jet printers since controllability of droplets is high and kinds of ink can be selected freely. The piezo system has two types: a MLP (Multi Layer Piezo) type and a ML Chip (Multi Layer Ceramic Hyper Integrated Piezo Segments) type. Alternatively, an ink-jet technology using what is called a thermal method in which a heating element is heated to generate bubbles thereby extruding a solution may be used depending on the material of the solvent.

Such a process of discharging dots of a composition may be preferably performed under reduced pressure. After the composition is discharged and before the composition reaches a subject, the solvent of the composition is evaporated; thus, steps of drying and baking the composition can be omitted. If the process is performed under reduced pressure, an oxide film or the like is not formed on the surface of the conductor, which is preferable. The process of applying the composition may be performed in a nitrogen atmosphere or an organic gas atmosphere.

In this occasion, the composition is discharged in the form of dots, in the form of a column with a series of dots, or the like. The ways of discharging the composition in the form of dots or a column may be merely referred to as dropping. In other words, a plurality of dots may be serially discharged so as to form a line; however, in either case, discharging the composition is collectively expressed as "dropping".

As a conductor, any one of gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), and aluminum (Al); an alloy thereof; dispersed nanoparticles thereof; or silver halide particles may be used. In particular, silver or copper which has low resistance may be used. Note that, in the case of using copper, a barrier film of an insulating film containing nitrogen or nickel boride (NiB) may be formed in order to prevent copper from diffusing into a semiconductor film or the like.

In addition, ITO (indium tin oxide), IZO (indium zinc oxide) in which zinc oxide (ZnO) of 2% to 20% is mixed into indium oxide, ITSO in which silicon oxide ($SiO_2$) of 2% to 20% is mixed into indium oxide, organic indium, organotin, titanium nitride (TiN), or the like can also be used as a transparent conductive film.

It is preferable to coat the surfaces of conductor particles with an organic material or with another conductor in order to disperse the conductor particles efficiently in the composition. The material coating the surfaces may have a layered structure. The material for coating the surfaces may preferably be conductive. In the case where the material for coating the surfaces is insulative, they are removed by heat treatment or the like.

FIG. 24A shows a dot containing Cu 301 which is dropped from a nozzle. The surface of the Cu 301 may be coated with a conductor 302, such as nickel (Ni) or nickel boride (NiB). For example, as shown in FIG. 24B, the Cu 301 may be coated with a conductor 302, such as nickel (Ni) or nickel boride (NiB); further, the surface of the nickel (Ni) or nickel boride (NiB) may be coated with Ag 303. As a result, thermal diffusion of Cu caused by heating or the like can be prevented.

A pattern formed selectively in this manner includes a mask for patterning electrodes such as a gate electrode, a source electrode and a drain electrode, and a pixel electrode; wirings such as a source wiring and a drain wiring; a semiconductor film; or the like.

According to the invention, a pattern may be formed by a method by which a pattern can be selectively formed, in at least one step of the pattern formation process required for fabricating a display device. In a step of the pattern formation process, the fabrication process may be simplified and the efficiency in the use of material may be improved by using the method by which a pattern can be selectively formed.

A display device according to the invention is a display device in which a TFT is connected to a light-emitting element where an organic material or a medium including a mixture of an organic material and an inorganic material which produces luminescence referred to as electroluminescence (hereinafter also referred to as "EL") is sandwiched between electrodes. The above-mentioned object is achieved by completing such a display device using a droplet discharge method.

According to the invention, a pattern is formed by a droplet discharge method, so that adhesion of the pattern is improved; further, the structure of the thin film transistor or the like is not limited. Accordingly, a thin film transistor may have either structure of a crystalline semiconductor film or an amorphous semiconductor film. For example, a thin film transistor having a structure called a bottom gate type in which a gate electrode is provided below a semiconductor film, or a structure called a top gate type in which a gate electrode is provided above a semiconductor film may be used.

As to any one of a gate electrode, a source electrode, a drain electrode, and a wiring connected to any of the electrodes included in a thin film transistor, adhesion can be improved by base pretreatment in the case of a droplet discharge method.

By using a droplet discharge method, the fabrication process can be simplified and the efficiency in the use of material may be improved. Thus, a transistor or the like can be formed over a mother glass substrate of the fifth generation or later. The formation of the wirings or the like by using a droplet discharge method simplifies the photo-process. Consequently, a photomask becomes redundant, and reduction in equipment cost can be achieved. Further, the photolithography process is not necessary; thus, the time of manufacture can be reduced.

When a mask or the like is formed by a droplet discharge method, the efficiency in the use of material may be improved and reduction in cost and liquid waste treatment time may be achieved. Thus, it is preferable to apply a droplet discharge method to a large mother glass substrate. Further, multiple display panels can be fabricated from one mother substrate; thus, the price of display devices can be expected to be reduced.

Thus, even as to a large mother glass substrate of the fifth generation or later, profitable production lines can be made by employing a droplet discharge method.

According to the invention, adhesion may be improved by base pretreatment before or after forming a pattern.

BRIEF DESCRIPTION OF DRAWINGS

FIGS. 1A to 1D are cross sectional views showing fabrication steps of a thin film transistor of the present invention.

FIGS. 4A to 4C are cross sectional views showing fabrication steps of a thin film transistor of the present invention.

FIGS. 5A to 5C are cross sectional views showing fabrication steps of a thin film transistor of the present invention.

FIGS. 7A to 7C are cross sectional views showing fabrication steps of a thin film transistor of the present invention.

FIGS. 9A and 9B are cross sectional views showing fabrication steps of a thin film transistor of the present invention.

BEST MODE FOR CARRYING OUT THE INVENTION

Figure 2A:
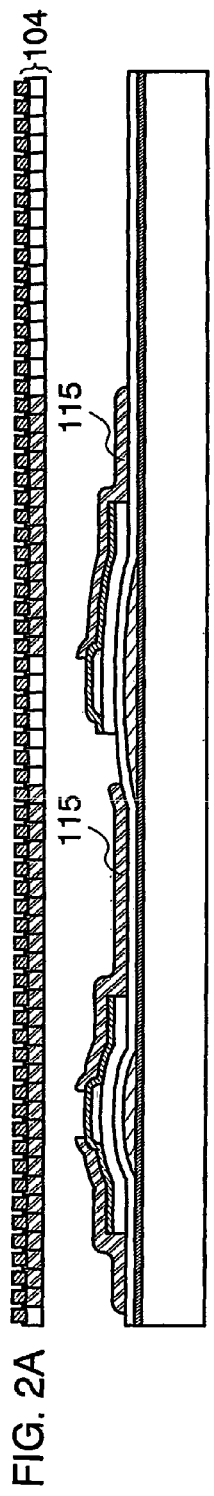
FIG. 2A to 2D are cross sectional views showing fabrication steps of a thin film transistor of the present invention.

Embodiment modes of the invention will be described below with reference to the drawings. Although the invention has been fully described by way of Embodiment Modes and with reference to the accompanying drawings, it is to be understood that various changes and modifications will be apparent to those skilled in the art. Therefore, unless such changes and modifications depart from the spirit and the scope of the invention hereinafter defined, they should be constructed as being included therein. In the drawings for describing the embodiment modes, the same reference numerals are commonly given to like components, and the components will not be described repeatedly.

Embodiment modes below will describe the case where ink-jet technology is used as a droplet discharge method; a TiOx film is used as a photocatalyst for base pretreatment; and Ag is used for a material of a gate electrode, a source electrode, and a drain electrode.

Embodiment Mode 1

In this embodiment mode, an example of a method for forming a first and a second thin film transistors.

First, as shown in FIG. 1A, a substrate 100 having an insulating surface is prepared. For example, a glass substrate such as barium borosilicate glass or alumino borosilicate glass; a quartz substrate; a stainless steel substrate, a bulk semiconductor film; or the like can be used for the substrate 100. Further, a substrate formed of a flexible synthetic resin such as acrylic or plastics typified by polyethylene-terephthalate (PET), a polyethylene naphthalate (PEN), and polyethersulfone (PES) generically has low heat-resistant temperature as compared with a substrate formed of another material. However, such a substrate can be used if it can endure a processing temperature of the fabrication process. In particular, in the case of forming a thin film transistor including an amorphous semiconductor film which does not require a heating process for crystallizing a semiconductor film, a substrate made of a synthetic resin can readily be used.

It is preferable that a surface of a substrate is polished in advance by chemical mechanical polishing (CMP) in order to improve the planarity. As the polishing agent (slurry) for CMP, for example, a slurry in which fumed silica particles obtained by thermally decomposing silicon chloride gas are dispersed in a KOH-added aqueous solution can be used.

A base film may be formed over the substrate 100 as necessary. The base film is formed in order to prevent an alkaline metal such as Na or an alkaline earth metal contained in the substrate 100 from spreading in a semiconductor film and exerting an adverse effect on semiconductor element characteristics. The base film can be therefore formed by using an insulating film such as silicon oxide, silicon nitride, silicon oxynitride, titanium oxide, or titanium nitride, which is capable of suppressing the spread of an alkaline metal or an alkaline earth metal into the semiconductor film. The base film can be formed by using a conductive film of titanium or the like. In this case, the conductive film is oxidized by heat treatment or the like in a manufacturing step in some cases. Specifically, a material of the base film may be selected from materials having high adhesion with a gate electrode material. For example, a base film of titanium oxide (TiOx) is preferably formed when Ag is used for the gate electrode Note that the base film may have a single layer structure or a layered structure.

A base film is not necessarily provided, as long as it is possible to prevent impurities from diffusing into a semiconductor film. As in this embodiment mode, when a semiconductor film is formed over a gate electrode with a gate insulating film therebetween, a base film is not needed since the gate insulating film can prevent impurities from diffusing into the semiconductor film. It is effective to provide a base film in order to prevent impurities from spreading in the case of using a substrate which contains somewhat alkaline metal or an alkaline earth metal, such as a glass substrate or a plastic substrate. Meanwhile, a base film is not required to be provided necessarily when using a quartz substrate or the like, in which impurity spread does not cause much trouble.

After that, a photocatalyst 101 is formed over the entire surface to carry out the base pretreatment in order to form a conductive film functioning as a gate electrode (hereinafter referred to a gate electrode). The photocatalyst can be formed by dip coating using a sol-gel method, spin coating, ink-jet, ion plating, an ion beam method, CVD, sputtering, RF magnetron sputtering, plasma spraying method, or an anodic oxidation method. In addition, in the case of a photocatalyst made of an oxide semiconductor including a plurality of metals, the photocatalyst can be formed by mixing and melting a salt of a constituent element. In the case of forming the photocatalyst by coating such as dip coating or spin coating, the photocatalyst may be baked or dried when it is necessary to remove the solvent. Specifically, it is heated at a predetermined temperature (for example, 150° C. to 500° C.).

In this embodiment mode, a TiOx film is formed as the photocatalyst over the entire surface by coating using sol-gel solution. The TiOx may have crystallinity of rutile type, anatase type, or a brookite type; or may have noncrystallinity. Subsequently, heating is carried out at 150° C. for ten minutes. In addition, heating at 250° C. to 500° C. for one hour may be carried out.

The TiOx film can improve the adhesion of the gate electrode.

A TiOx film may be selectively formed over the area to be provided with the gate electrode. In this case, the gate electrode can be made finer as to selectively form an area where TiOx is strongly adhered to the gate electrode TiOx may be selectively applied by applying TiOx over the entire surface and thereafter removing a necessary portion by wet etching or dry etching. Further, after the TiOx is applied over the entire surface, activation may be carried out by selective light exposure in order to improve the adhesion with the gate electrode.

Alternatively, a conductive film of Ti or the like may be formed by sputtering for base pretreatment. Consequently, the adhesion of the gate electrode may be improved, and the gate electrode can be made finer. Ti may be selectively applied to an area to be provided with a gate electrode as with the TiOx film. Further, TiOx may be formed over the surface by oxidizing Ti.

Alternatively, an organic film of such as a coupling agent may be formed by ink-jet for the base pretreatment. A silane-based coupling agent, fluorine-based coupling agent, or the like may be used as the coupling agent. As a result, the adhesion of the gate electrode may be improved or miniaturization of the gate electrode may be achieved. Further, as with the TiOx film, an organic film may be selectively formed in the area to be provided with the gate electrode.

The film formed for the base pretreatment can also serve as a base film. Accordingly, a TiOx film may be formed as a base film and a photocatalyst.

As still another base pretreatment, plasma treatment may be performed on the surface to be provided with the gate electrode. The plasma treatment is performed under conditions as follows: air, oxygen or nitrogen is used as a treatment gas, the pressure is several tens of Torr to 1000 Torr (133000 Pa), preferably, 100 Torr (13300 Pa) to 1000 Torr (133000 Pa), further preferably, 700 Torr (93100 Pa) to 800 Torr (106400 Pa).

Namely, pulse voltage is applied in a state of atmospheric pressure or pressure in the neighborhood of atmospheric pressure. At the time, plasma density is $1\times10^{10}$ m$^{-3}$ to $1\times10^{14}$ m$^{-3}$ to be in a condition of so-called corona discharge or glow discharge. The plasma treatment may preferably be performed without a contact with a surface to be provided with a gate electrode. Consequently, the adhesion of the gate electrode may be improved, and the gate electrode can be made fine. An area to be provided with a gate electrode may be selectively treated with plasma as with the TiOx film.

A gate electrode 103 is formed by dropping a dot including a conductive material mixed into a solvent in a first thin film transistor forming region 11 and a second thin film transistor forming region 12 by ink-jet. In this embodiment mode, a dot in which a conductive material of silver (Ag) is dispersed in a solvent of tetradecane is dropped. At this point, a dot is dropped from a nozzle 104 of an ink-jet system above the area where the gate electrode is to be formed. The gate electrode is formed as if drawn by thus dropping a dot from a nozzle.

After that, when the solvent of the dot is required to be removed, heat treatment for baking or drying is conducted. Specifically, heat treatment may be conducted preferably in an atmosphere containing oxygen at a predetermined temperature, e.g. 200° C. to 300° C. At the time, heating temperature is set so as not to produce unevenness on a surface of the gate electrode. As in this embodiment mode, in the case of using a dot having silver (Ag), heat treatment is performed in an atmosphere containing oxygen or nitrogen. For example, the component ratio of oxygen is set to be 10% to 25%. Correspondingly, an organic material such as a thermosetting resin of an adhesive contained in a dot of a solvent is decomposed; thus, silver (Ag) which does not contain an organic material can be obtained. Consequently, planarity of a gate electrode surface can be improved and specific resistance value can be lowered.

The gate electrode can be made of an element selected from tantalum, tungsten, titanium, gold, molybdenum, aluminum, and copper (Cu), or an alloy material or a compound material mainly containing the element, other than silver (Ag). The conductive film can be formed by sputtering or plasma CVD instead of ink-jet. A semiconductor film typified by a polycrystalline silicon film doped with an impurity element such as phosphorus or an AgPdCu alloy can be used as the conductive film formed by sputtering or plasma CVD.

The gate electrode may have either a single layer structure or a layered structure. For example, dots containing Ag are applied to form a bottom conductive film by ink-jet, and Cu may be applied to form a top conductive film by ink-jet or by sputtering. By applying a low resistant material like Cu, wiring resistance may be reduced, and heating or signal delay due to the wiring resistance can be prevented. Base pretreatment may be performed on the bottom conductive film, and the top conductive film may be formed thereafter. Consequently, adhesion especially between the bottom conductive film and the top conductive film which are formed by ink-jet can be improved.

Plating may be used for forming a gate electrode having a layered structure. For example, a second conductive film may be formed by electroplating or electroless plating, around a first conductive film formed by ink-jet. Specifically, Cu may be applied by electroplating, around Ag applied by ink-jet. Alternatively, Cu may be applied by electroless plating in which electric current is unnecessary, around Ag applied by ink-jet. As a result, wiring resistance may be reduced, and heating or signal delay due to the wiring resistance can be prevented. In particular, in the case of forming the first conductive film finely, it is preferable to form the second conductive film, so that the wiring resistance can be reduced. Further, in the case of forming a highly diffusible conductor such as Cu, a barrier film may be preferably formed so as to cover Cu in order to prevent diffusion thereof. Silicon nitride, silicon oxide, nickel boride (NiB) can be used for the barrier film.

In this case, plating may be performed by dipping the substrate in a solution in which metal is dissolved. Further in the case of using a large mother glass substrate, plating may be performed by flowing a solution in which metal is dissolved over the substrate. Thus, an apparatus for the plating is not required to be large.

As in this embodiment mode, the base pretreatment may be preferably performed before forming a conductive film, especially by ink-jet.

Further, an insulating film or a conductive film may be formed so as to cover the gate electrode. Silicon nitride or silicon oxide may be used for the insulating film, and nickel boride (NiB) may be used for the conductive film. Accordingly, the gate electrode can be prevented from being oxidized, and the surface thereof can be further leveled.

As shown in FIG. 1B, an insulating film which serves as a gate insulating film 105 (hereinafter also referred to as a gate insulating film) is formed to cover the gate electrode. An insulator such as silicon oxide, silicon nitride or silicon oxynitride may be formed as the gate insulating film by plasma CVD or sputtering. Note that a dot including a material of an insulating film such as polyimide may be discharged by an ink-jet to form the gate insulating film. As in this embodiment mode, when the gate electrode is made of silver (Ag), it is preferable that a silicon nitride film is used for the insulating film in contact with Ag as the gate insulating film. This is because there is a risk that a surface of the gate electrode becomes rough since silver oxide is formed by a reaction with silver (Ag), in the case of using an insulating film containing oxygen.

The gate insulating film may have either a single layer structure or a layered structure. For example, a gate insulating film in which silicon nitride, silicon oxide, and silicon nitride are stacked in order may be formed. Further, a gate insulating film may be formed after base pretreatment for improving the adhesion between a gate electrode and a gate insulating film. For example, a TiOx film and a gate insulating film may be sequentially stacked over a gate electrode. Here, the TiOx film also serves as an insulating film.

As in this embodiment mode, the base pretreatment may be preferably formed after forming a conductive film, especially by ink-jet.

A semiconductor film 106 is formed over the gate insulating film. The semiconductor film can be formed by plasma CVD, sputtering, ink-jet, or the like. The thickness of the semiconductor film may preferably be 25 nm to 200 nm (preferably, 30 nm to 60 nm). Silicon germanium instead of silicon can be used for the material of the semiconductor film. In the case of using silicon germanium, the concentration of germanium is preferably about 0.01 atomic % to 4.5 atomic %.

The semiconductor film may be formed of an amorphous semiconductor, a semiamorphous semiconductor in which crystal grains are dispersed in an amorphous semiconductor, a micro crystal semiconductor in which crystal grains of 0.5 nm to 20 nm can be seen in an amorphous semiconductor, an organic semiconductor, or a crystalline semiconductor. A state of a micro crystal in which crystal grains of 0.5 nm to 20 nm can be seen is referred to as a micro crystal (μc).

Semiamorphous silicon using silicon (also referred to as SAS) as a material of a semiamorphous semiconductor can be obtained by glow discharge decomposition of a silicide gas. SAS may also be formed with the use of fluorine ($F_2$) in addition to the silicide gas. As a typical silicide gas, $SiH_4$ is used; besides, $Si_2H_6$, $SiH_2Cl_2$, $SiHCl_3$, $SiCl_4$, $SiF_4$ or the like can be used. SAS can easily be formed by a silicide gas diluted with hydrogen, or hydrogen and one or more rare gas elements selected from helium, argon, krypton, and neon. The silicide gas is preferably diluted so that the dilution rate is in the range of 10 times to 1000 times. SAS can be also formed by diluting $Si_2H_6$ and $GeF_4$ with helium gas.

The reactive formation of a film by glow discharge decomposition is preferably conducted under reduced pressure, and the pressure may be about 0.1 Pa to 133 Pa. The power for glow discharge may be 1 MHz to 120 MHz, preferably, a high frequency power of 13 MHz to 60 MHz. The substrate heating temperature is preferably 300° C. or less, and more preferably, a substrate heating temperature of 100° C. to 250° C. is recommended.

Amorphous silicon using silicon (also referred to as AS) as a material of an amorphous semiconductor can be formed with the use of silicide gas. As a typical silicide gas, $Si_2H_6$, $SiH_2Cl_2$, $SiHCl_3$, $SiCl_4$, $SiF_4$, or the like may be used as well as $SiH_4$. The silicide gas may be diluted with hydrogen or hydrogen and one or more rare gas elements selected from helium, argon, krypton, and neon. In this embodiment mode, an amorphous silicon film is formed as a semiconductor film by plasma CVD.

Such a SAS or an AS may have a single layer structure or a layered structure. In the case of a layered structure, SAS or AS can be consecutively formed without being exposed to the atmosphere by changing the kind of a film formation gas or the flow rate. For example, SAS having a layered structure may be formed by first applying silicide gas and fluorine-based gas and thereafter replacing the fluorine-based gas with hydrogen-based gas.

Subsequently, an insulating film serving as a channel protective film (hereinafter referred to as a channel protective film) 108 is formed over the semiconductor film. An organic material or an inorganic material can be used for a material of the channel protective film. Polyimide, acrylic, polyamide, polyimideamide, benzocyclobutene, siloxane, polysilazane, or a resist material can be used as the organic material. Siloxane is formed with a skeletal structure made of a bond of silicon (Si) and oxygen (O), and contains hydrogen as a substituent, or contains at least one of fluorine, alkyl group, and aromatic hydrocarbon as the substituent. Polysilazane is formed with liquid material containing polymer material having a bond of silicon (Si) and nitrogen (N). As an inorganic material, either silicon oxide or silicon nitride can be used.

The channel protective film may be formed by ink-jet or plasma CVD. In the case of employing ink-jet, the channel protective film may be selectively formed over the semiconductor film. Meanwhile in the case of plasma CVD, the channel protective film is required to be etched. Here, the channel protective film may be etched using a mask which has been formed over the channel protective film. For example, the mask may be formed over the channel protective film by exposure from back side using the gate electrode as a mask, or the mask may be selectively formed over the channel protective film by ink-jet.

Next, a semiconductor film having one conductivity is formed. The semiconductor film having one conductivity may be formed by plasma CVD, sputtering, ink-jet, or the like. It is preferable to provide the semiconductor film having one conductivity since the contact resistance between the semiconductor film and the electrode is reduced; however, the semiconductor film needs not be formed necessarily. In this embodiment mode, an n-type semiconductor film 109 which has n-type conductivity is formed by plasma CVD.

As shown in FIG. 1C, a mask 111 for patterning a semiconductor film 106 and the n-type semiconductor film 109 to desired shapes is formed. It is preferable to form the mask by ink-jet in order to improve efficiency in the use of material and to reduce costs and the amount of liquid waste. Alternatively, the mask may be formed by photolithography. Further, in the case of forming the mask by ink-jet, photolithography process can be simplified. For example, steps of the formation of a photomask and exposure are redundant, and reduction in costs of equipment and time of manufacture can be achieved. In this embodiment mode, the mask is formed by ink-jet. Dots containing a mask material are applied from nozzles 104 above an area to be provided with the mask.

As the mask material, an inorganic material (such as silicon oxide, silicon nitride, or silicon oxynitride), a photosensitive or non-photosensitive organic material (such as polyimide, acrylic, polyamide, polyimideamide, polyvinyl alcohol, benzocyclobutene, or a resist material). For example, in the case of forming the mask by ink-jet using polyimide, preferably, polyimide may be applied to the desired portions by ink-jet and may be thereafter heat treated at 150° C. to 300° C. for baking.

As shown in FIG. 1D, the semiconductor film 106 and the n-type semiconductor film 109 are etched by dry etching or wet etching using masks. After the etching, plasma treatment or the like is performed in order to remove the masks. Note that the masks may not be necessarily removed, so that the masks may serve as insulating films.

As shown in FIG. 2A, conductive films serving as a source electrode and a drain electrode (hereinafter referred to as a source electrode and a drain electrode) are formed. A film containing an element of gold, silver, copper, aluminum, titanium, molybdenum, tungsten, or silicon, or an alloy film containing the elements above can be used for the conductive films. The conductive films may be formed by ink-jet, CVD, or sputtering. In this embodiment mode, the source electrode and the drain electrode 115 are formed by ink-jet, discharging dots containing conductors in a solvent. Specifically, the electrodes may be formed in a similar manner to the gate electrode shown in FIG. 1A; dots in which conductors of silver (Ag) are dispersed in a tetradecane solvent are applied. Here, the dots are discharged from the nozzles 104 above the source electrode and the drain electrode so as to be applied over the desired areas. The source electrode and the drain electrode may have either a single layer structure or a layered structure as with the gate electrode.

In the case of using Ag for the source electrode and the drain electrode as in this embodiment mode, a silicon nitride film may be formed as an insulating film serving as a protective film. Thus, roughness of the surface of the gate electrode can be avoided.

Alternatively, base pretreatment may be performed before and/or after forming conductive films serving as a source electrode and a drain electrode. As a result, the adhesion of the source electrode and the drain electrode can be improved. For example, a TiOx film or a Ti film may be thinly formed over the n-type semiconductor film, and a source electrode and a drain electrode may be formed by ink-jet.

Then, if necessary, the solvent of the dots may be removed by heat treatment for baking or drying as the gate electrode. In the case of using dots containing silver (Ag) as in this embodiment mode, heat treatment may be performed in an atmosphere containing oxygen and nitrogen. For example, the composition ratio of the oxygen may be set at 10% to 25%.

Further, the source electrode or the drain electrode may be plated as above.

Figure 2B:
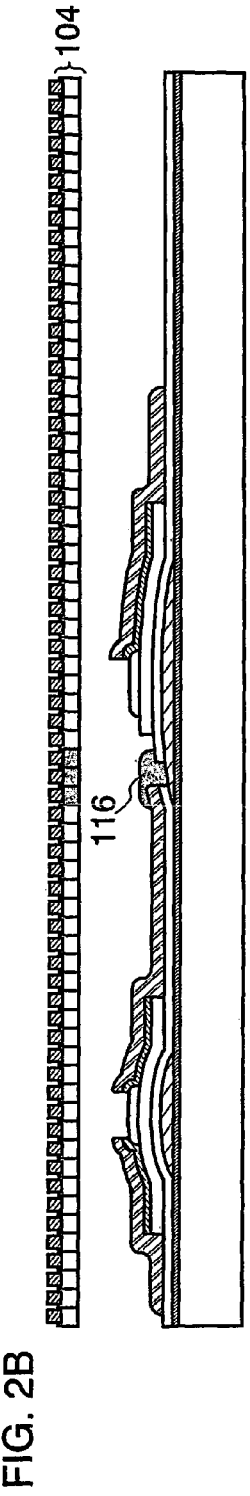

As shown in FIG. 2B, the n-type semiconductor film 109 may be etched by using the source electrode and the drain electrode as masks; so that the source electrode and the drain electrode are prevented from shorting to the n-type semiconductor film. At this point, the channel protective film would be etched to some extent. Thus, active elements serving as the first and the second thin film transistors may be completed.

Subsequently, a contact hole is formed in the gate insulating film by dry etching or wet etching, so that the source electrode or the drain electrode of the first thin film transistor and the gate electrode of the second thin film transistor are connected. At this point, a mask is formed (not shown), and a contact hole can be formed in the gate insulating film by using the mask. The mask may be formed by ink-jet or photolithography. The contact hole may be formed in the gate insulating film by using the source electrode or the drain electrode as masks. In this case, the gate insulating films over the region where the source electrode and the drain electrode are not formed is removed.

Thereafter, a conductive film 116 for connecting the source electrode or the drain electrode of the first thin film transistor and the gate electrode of the second thin film transistor is formed over the contact hole. A film containing an element of gold, silver, copper, aluminum, titanium, molybdenum, tungsten, or silicon, or an alloy film containing the elements above can be used for the conductive films. In this embodiment mode, the conductive film is formed by ink-jet. Accordingly, the dots containing a conductive material are discharged from the nozzles 104 above the area to be provided with the conductive film.

In this case, the conductive film 116 may be formed as parts of the source electrode or the drain electrode.

Before forming the gate insulating film, the conductive film may be formed to a columnar shape in order to connect the source electrode or the drain electrode of the first thin film transistor to the gate electrode of the second thin film transistor. After forming the gate insulating film, the gate insulating film is etch-backed so as to expose the edge of the columnar conductive film. The source electrode or the drain electrode of the first thin film transistor and the gate electrode of the second thin film transistor can be connected through the columnar conductive film. In this case, contact holes are not required to be formed in the gate insulating film.

As described above, a thin film transistor in which a source electrode and a drain electrode have been provided is completed. A thin film transistor in this embodiment mode is what is called a bottom gate thin film transistor whose gate is provided below a semiconductor film. Specifically, the thin film transistor is called a channel protective type provided with a channel protective film. A substrate provided with a plurality of such transistors is referred to as a TFT substrate.

Figure 2C:
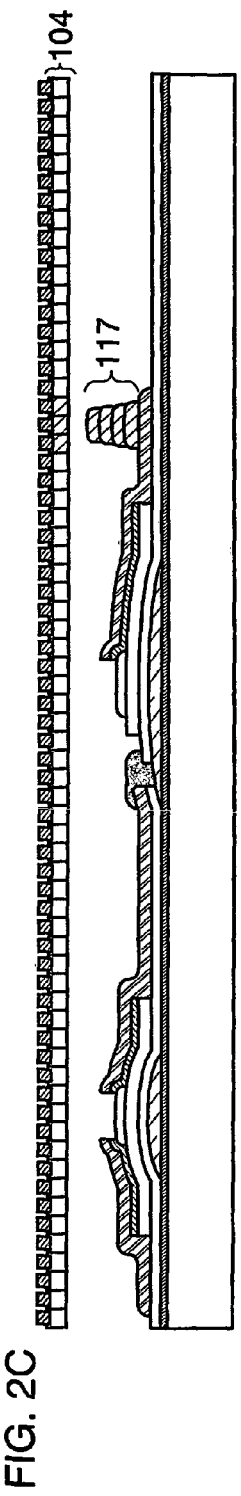

As shown in FIG. 2C, a columnar conductive film 117 is formed over the source electrode or the drain electrode of the second thin film transistor. A film containing an element of gold, silver, copper, aluminum, titanium, molybdenum, tungsten, or silicon, or an alloy film containing the elements above can be used for the columnar conductive film. The columnar conductive film may be formed by ink-jet, CVD, or sputtering. In this embodiment mode, the columnar conductive film is formed by ink-jet. In the case of ink-jet, dots are discharged from the nozzles 104 above the area to be provided with the conductive film. Here, the dots may preferably be dropped for several times in order to form the columnar conductive film to the desired height. Further, it is preferable to perform heat treatment each time dots are applied. The conductive film is baked by the heat treatment, and appropriate hardness can be obtained; thus, the columnar conductive film can easily be formed. If the viscosity of the dots containing a conductor is appropriate, the columnar conductive film may be formed by one time or a few times of dot application.

Figure 2D:
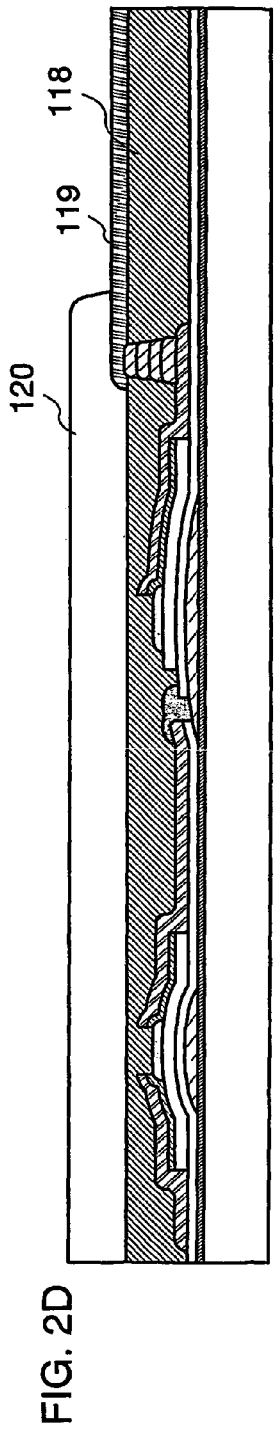

As shown in FIG. 2D, an insulating film (hereinafter referred to as an interlayer insulating film) 118 is formed. An organic resin or an inorganic resin may be used for the interlayer insulating film. Polyimide, acrylic, polyamide, polyimideamide, benzocyclobutene, siloxane, polysilazane, or a resist material can be used as the organic material. Silicon oxide or silicon nitride may be used as the inorganic material. Further, the interlayer insulating film may be formed by coating such as spin coating, dip coating; plasma CVD, or inkjet. If a mother glass substrate is larger, it would be difficult to apply spin coating. Therefore, a large mother glass may be disposed slantingly, so that a solution containing a material of the interlayer insulating film is applied from the upper edge of the substrate. Preferably, the planarity can be improved by forming the interlayer insulating film.

Further, base pretreatment may be performed after forming the source electrode and the drain electrode in order to improve adhesion of the source electrode and the drain electrode, and the interlayer insulating film.

Thereafter, a pixel electrode 119 is formed so as to connect to the columnar conductive film 117. The interlayer insulating film is etch-backed to expose an end portion of the columnar conductive film as necessary. The pixel electrode may be formed by sputtering or ink-jet. Further, the pixel electrode may be formed of a light transmitting or a non-light-transmitting material. For example, ITO or the like may be used for the light-transmitting material, and a metal film may be used for the non-light-transmitting material. As a specific material of the pixel electrode, indium tin oxide (ITO), indium zinc oxide (IZO) in which 2% to 20% of zinc oxide (ZnO) is mixed in indium oxide, ITO-SiOx (referred to as ITSO or NITO for convenience) in which 2% to 20% of silicon oxide ($SiO_2$) is mixed in indium oxide, organic indium, organotin, titanium nitride (TiN), or the like may be used. In this embodiment mode, a pixel electrode may be formed of NITO by sputtering. In the case of using NITO for the pixel electrode, NITO may be preferably formed after a silicon nitride film is formed over the interlayer insulating film.

Next, an insulating film 120 serving as a partition or a bank may be formed to cover an end portion of the pixel electrode 119. An inorganic material (such as silicon oxide, silicon nitride, silicon oxynitride), a photosensitive or non-photosensitive organic material (such as polyimide, acrylic, polyamide, polyimideamide, benzocyclobutene, or a resist material), siloxane, polysilazane, or a laminated structure thereof can be used. As the organic material, positive photosensitive organic resin or negative photosensitive organic resin can be used. For example, in the case of using positive photosensitive acrylic as the organic material, the photosensitive organic resin is etched by light exposure to form an opening with a curvature in the upper end portion. This can avoid discontinuity of an electroluminescent layer to be formed later or the like. The TFT substrate in this state is referred to as a module TFT substrate.

Figure 22:
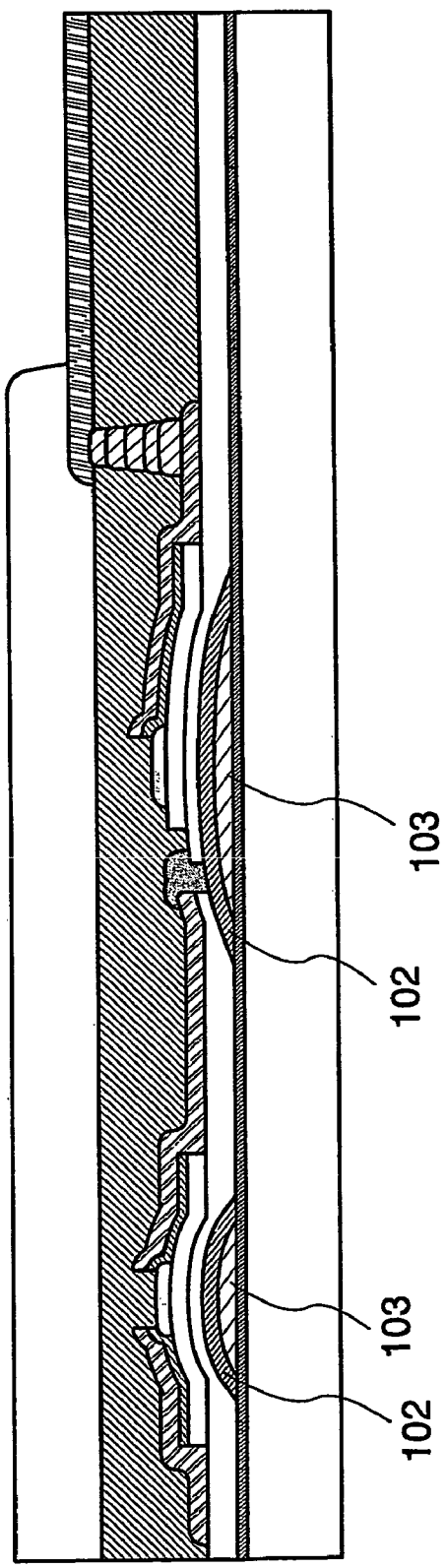
FIG. 22 is a cross sectional view showing a fabrication step of a thin film transistor of the present invention.

A cross sectional view of a gate electrode having a layered structure formed by plating is shown in FIG. 22. A conductive film 102 formed of copper is formed around the gate electrode 103 by plating. Other structures are as in FIG. 2D, and the description thereof will be omitted.

Further, a conductive film made of copper may be formed around the source electrode or the drain electrode.

In FIG. 23, a mode of electroplating is shown, and the case of dicing for obtaining four panels from a large mother glass substrate will be described.

Figure 23A:
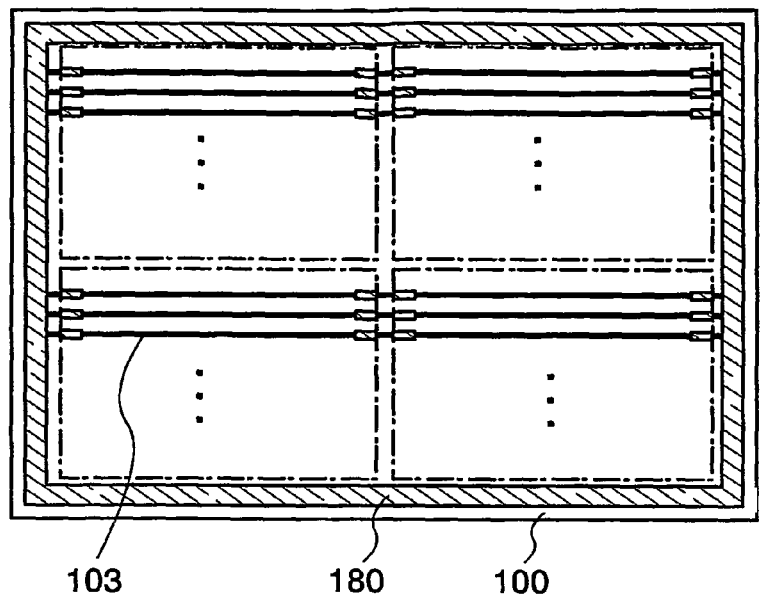
FIGS. 23A to 23C are views showing an apparatus for forming a thin film transistor of the present invention.

As shown in FIG. 23A, Ag is applied, for example, by ink-jet in the same layer as the gate electrode 103 to form a conductive film 180 for supplying current. The conductive film 180 may be formed of a material different from the gate electrode or may be formed of Cu to be treated with electroplating. Hereupon, Cu may preferably be applied on a gate electrode formed of Ag. Consequently, Cu can be formed uniformly by plating.

Figure 23B:
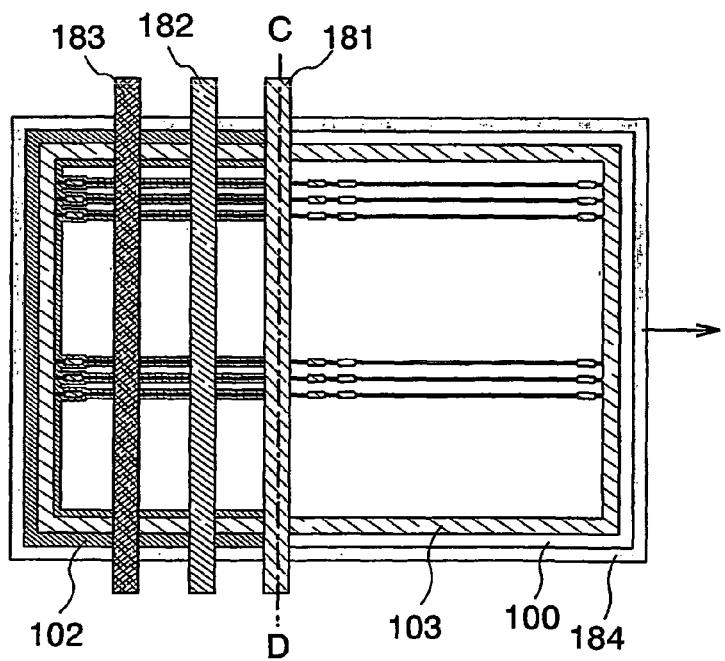

As shown in FIG. 23B, the substrate 100 is secured to a stage 184, and a head 181 for applying a solution in which metal is dissolved, a head 182 for washing the solution in which the metal is dissolved, and a head 183 for spraying a gas to dry are sequentially disposed above the substrate. By thus arranging a plurality of nozzles, consecutive treatment can be achieved and throughput can be improved. In the case of applying Cu by electroplating, a solution containing copper sulfate and dilute sulfuric acid can be used as the solution in which the metal is dissolved. Oxygen, nitrogen, or the mixture thereof may be used as the gas to dry. Further, hot gas may be sprayed for accelerating drying.

In this state, the substrate 100 is moved in the direction of the arrow, and electroplating can be performed on the large mother glass substrate. The substrate 100 and the heads 181, 182, and 183 may be moved relatively.

Figure 23C:
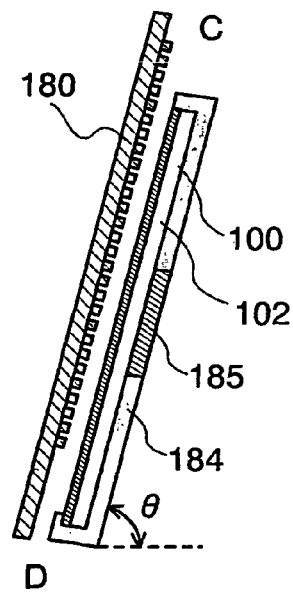
Figure 24A:
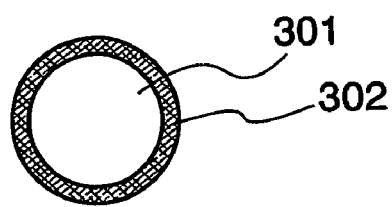
FIGS. 24A and 24B each show a form of a dot of the present invention.
Figure 24B:
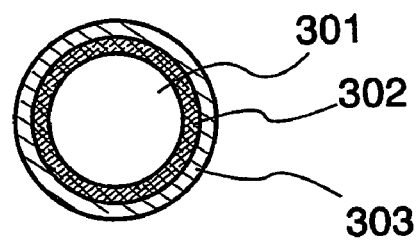

As shown in FIG. 23C, the substrate 100 is secured to the stage 184 and arranged slanting to have an angle of θ. The angle θ may range 0°<θ<90°, preferably, 45°<θ<80°. Further, the solution may be sprayed from the head 181 with high pressure at an angle ranging 90°<θ<120°. Similarly, washing water is sprayed from the head 182, and the gas is sprayed from the head 183 with high pressure. In this case, the solution drops without flowing on the substrate 100; accordingly, unevenness of the solution can be avoided. Since the substrate is disposed slantingly as above, the plating machine is prevented from being larger even the mother glass substrate is larger.

Further, the stage 184 includes conductors and an insulator 185. One of the conductors serves as an anode and the other serves as a cathode. Plating may be performed by flowing current to them. The stage 184 may be provided with conductors and an insulator separately.

In addition, unlike this embodiment mode, plating may be performed by dipping the substrate 100 in a solution in which metal is dissolved.

Further, a conductive film 102 may be formed around the gate electrode by electroless plating which does not require current flow due to reduction of metal ions in the solution. In this case, the conductive film 180 used for flowing current is unnecessary.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. In particular, when a mask is formed by ink-jet, the process can be simplified in comparison with photolithography. Consequently, costs such as equipment costs, and time of manufacture can be reduced.

As thus described, a thin film transistor having a gate electrode, a source electrode and a drain electrode which are made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 2

In this embodiment mode, an example of forming a first and a second thin film transistor with a method different from the above embodiment mode will be described. Specifically, a contact hole provided in an interlayer insulating film is formed in a different manner. The other structure is similar to the above embodiment mode; accordingly, the description will be omitted.

Figure 3A:
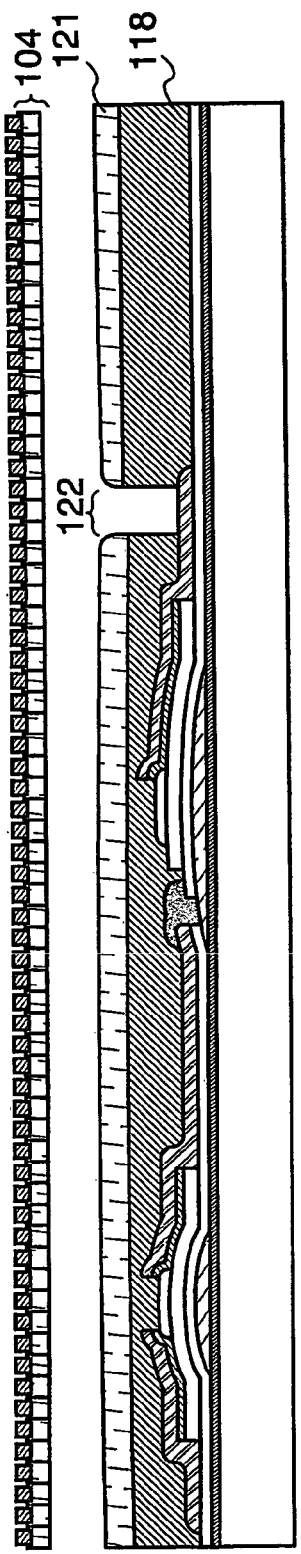
FIGS. 3A to 3C are cross sectional views showing fabrication steps of a thin film transistor of the present invention.

As shown in FIG. 3A, a first and a second thin film transistors are formed as in the above embodiment mode. In this embodiment mode, an interlayer insulating film 118 is formed so as to cover the first and the second thin film transistors without forming a columnar conductive film.

Subsequently, a mask is formed over the interlayer insulating film. The mask may be formed by ink-jet or photolithography. In this embodiment mode, the mask is formed by ink-jet. When the mask is formed by ink-jet, a photolithography process can be simplified. In other words, a step of forming a photomask, a light-exposure step, and the like are not required. Thus, facility investment costs can be reduced and time of manufacture can be shortened. Here, a dot containing a mask material is dropped from the nozzle 104 above the area where the mask is to be formed.

Thereafter, a contact hole 122 is formed in an interlayer insulating film by dry etching using the mask. The contact hole is formed in a portion connected to the source electrode or the drain electrode of the second thin film transistor.

Figure 3B:
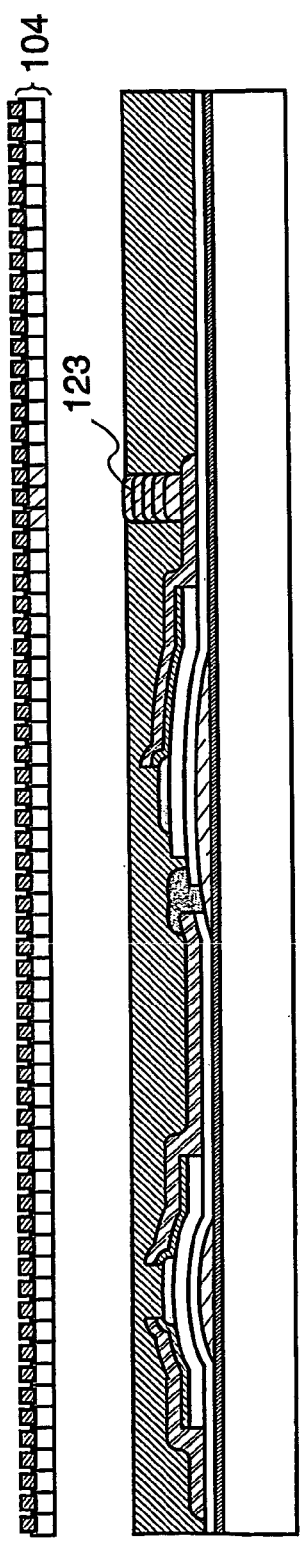

As shown in FIG. 3B, a columnar conductive film 123 is formed in the contact hole. A film containing an element of gold, silver, copper, aluminum, titanium, molybdenum, tungsten, or silicon, or an alloy film containing the elements above can be used for the columnar conductive films. The columnar conductive film may be formed by ink-jet, CVD, or sputtering. In this embodiment mode, the columnar conductive film is formed by ink-jet. In the case of ink-jet, dots are discharged from nozzles 104 above the area to be provided with the conductive film. On this occasion, the dots may preferably be dropped plural times in order to form the columnar conductive film to the desired height. In this embodiment mode, it is not necessary to perform heat treatment each time a dot is applied since the side wall of the contact hole can bank.

Figure 3C:
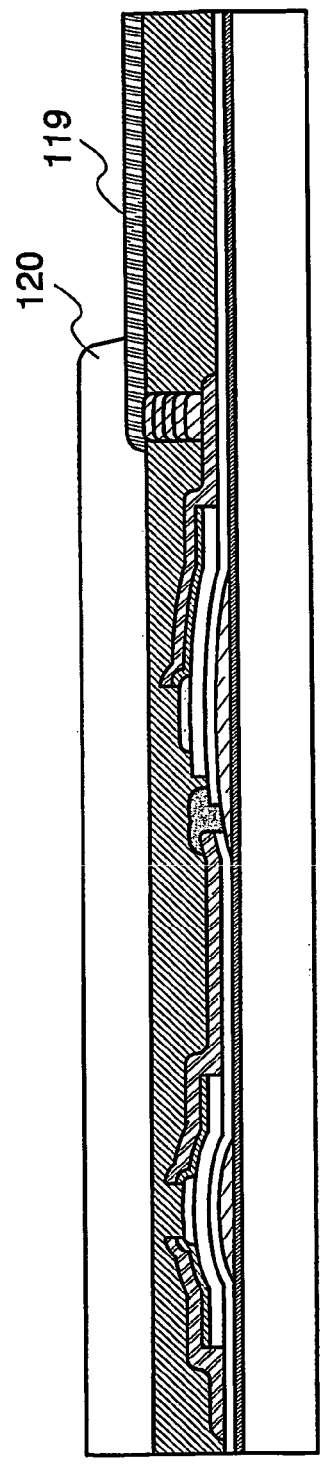

As shown in FIG. 3C, a pixel electrode 119 is formed so as to connect to the columnar conductive film as in the above embodiment mode. Thereafter, an insulating film 120 serving as a bank or a partition is formed so as to cover an end portion of the pixel electrode. Thus, a module TFT substrate can be formed.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source electrode and a drain electrode which are made finer by base pretreatment can be obtained. Further, in the case of selectively performing base pretreatment, wirings can be formed along the area treated with the base pretreatment even dots are discharged out of alignment in some degree; thus, the alignment of wiring formation can be enabled.

Embodiment Mode 3

In this embodiment mode, an example of forming a first and a second thin film transistors with a method different from the above embodiment mode will be described. Specifically, an interlayer insulating film is formed in a different manner. The other structure is similar to the above embodiment mode; accordingly, the description will be omitted.

As shown in FIG. 4A, a first and a second thin film transistors are formed as in the above embodiment mode, and an interlayer insulating film is formed so as to cover the first and the second thin film transistors. In this embodiment mode, the interlayer insulating film is formed by ink-jet. The interlayer insulating film 125 is formed so as not to overlap one of a source electrode or a drain electrode of the second thin film transistor, which is connected to a pixel electrode. Hereupon, dots containing a material of the insulating film are discharged from nozzles 104 above a region to be provided with the interlayer insulating film. Such an interlayer insulating film as shown in FIG. 4A can be formed by appropriately setting the viscosity of the dots. Consequently, a contact hole for connecting the pixel electrode to the interlayer insulating film is not necessary.

As shown in FIG. 4B, the pixel electrode 119 is formed over an opening 126 of the interlayer insulating film. The pixel electrode can be formed by sputtering or ink-jet. Further, the pixel electrode can be formed of a light-transmitting or non-light-transmitting material. For example, ITO or the like may be used as the light-transmitting material, and a metal film may be used as the non-light-transmitting material. As a specific material of the pixel electrode, indium tin oxide (ITO), indium zinc oxide (IZO) in which 2% to 20% of zinc oxide (ZnO) is mixed in indium oxide, ITO-SiOx (referred to ITSO or NITO for convenience) in which 2% to 20% of silicon oxide ($SiO_2$) is mixed in indium oxide, organic indium, organotin, titanium nitride (TiN), or the like may be used. In this embodiment mode, dots containing a transparent conductor material are discharged from the nozzles 104 to form the pixel electrode 119.

As shown in FIG. 4C, an insulating film 120 serving as a bank or a partition may be formed so as to cover the end portion of the pixel electrode and the pixel electrode over the opening (also collectively referred to as a part of the pixel electrode). Here, the insulating film 120 is formed to cover a part of the pixel electrode out of the flat area, exposing the pixel electrode in a flat area. Consequently, discontinuity of the electroluminescent layer to be formed later can be prevented. Further, the electroluminescent layer may be formed over the opening of the interlayer insulating film without forming the insulating film 120. Thus, a module TFT substrate can be formed.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source and a drain electrode which are made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 4

In this embodiment mode, an example of forming a first and a second thin film transistors with a method different from the above embodiment mode will be described. Specifically, a contact hole and an interlayer insulating film are formed in a different manner. The other structure is similar to the above embodiment mode; accordingly, the description will be omitted.

As shown in FIG. 5A, a first and a second thin film transistors are formed as in the above embodiment mode. An interlayer insulating film 118 is formed by ink-jet so as to cover the thin film transistors after an organic film 128 which is liquid repellent and has columnar shape is formed. In this occasion, the interlayer insulating film is not formed on the organic film since the organic film is repellent to the interlayer insulating film.

The organic film may be formed of, for example, PVA (polyvinyl alcohol) or FAS (fluoroalkyl silane) by ink-jet. Further, the organic film is treated with plasma, laser, an electron beam, or the like. Consequently, the liquid repellency of the organic film can be improved. As for details, Japanese Patent Application No. 2003-344880 of the applicant may be referred to.

As shown in FIG. 5B, the organic film 128 may be selectively removed by dry etching, wet etching, etching using atmospheric plasma, water washing, or treatment using laser or an electron beam. In this embodiment mode, the organic film 128 is removed by water washing. Thus, the region where the organic film is removed can be used as a contact hole 129.

As shown in FIG. 5C, a pixel electrode 119 is formed. The pixel electrode can be formed by sputtering or ink-jet. Further, the pixel electrode can be formed of a light-transmitting or non-light-transmitting material. For example, ITO or the like may be used for the light-transmitting material, and a metal film may be used for the non-light-transmitting material. As a specific material of the pixel electrode, indium tin oxide (ITO), indium zinc oxide (IZO) in which 2% to 20% of zinc oxide (ZnO) is mixed in indium oxide, ITO-SiOx (referred to ITSO or NITO for convenience) in which 2% to 20% of silicon oxide ($SiO_2$) is mixed in indium oxide, organic indium, organotin, titanium nitride (TiN), or the like may be used. In this embodiment mode, dots containing a transparent conductor material are dropped from the nozzles 104 to form the pixel electrode 119. In this occasion, the amount of dots from the nozzles 104 above the contact hole is controlled.

Thereafter, as in the above embodiment mode, an insulating film serving as a bank or a partition may be formed to cover the end portion of the pixel electrode. Thus, a module TFT substrate can be formed.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source electrode, and a drain electrode made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 5

In this embodiment mode, an example of forming a first and a second thin film transistors with a method different from the above embodiment mode will be described. Specifically, a contact hole and an interlayer insulating film are formed in a different manner. The other structure is similar to the above embodiment mode; accordingly, the description will be omitted.

Figure 6A:
FIGS. 6A to 6D are cross sectional views showing fabrication steps of a thin film transistor of the present invention.

As shown in FIG. 6A, a first and a second thin film transistors are formed as in the above embodiment mode. Thereafter, a film 136 which is repellent to an interlayer insulating film is formed on the surface to be provided with the interlayer insulating film, over the source electrode and the drain electrode, a channel protective film, and a the gate insulating film, or the like. For example, PVA (polyvinyl alcohol) or FAS (fluoroalkyl silane) may be applied by ink-jet as the film which is liquid repellent.

Figure 6B:

As shown in FIG. 6B, a mask 131 is selectively formed. The mask may be formed of for example polyimide, polyvinyl alcohol, or the like by ink-jet. The film 136 which is liquid repellent is selectively removed with the use of the mask 131. The film 136 may be removed by dry etching, wet etching, etching using atmospheric plasma, water washing, or treatment using laser or an electron beam. In this embodiment mode, the film which is liquid repellent is removed by plasma treatment using oxygen gas under atmospheric pressure. Thereafter, the mask 131 is removed by a similar method. In this embodiment mode, the mask can be removed by water washing.

Figure 6C:
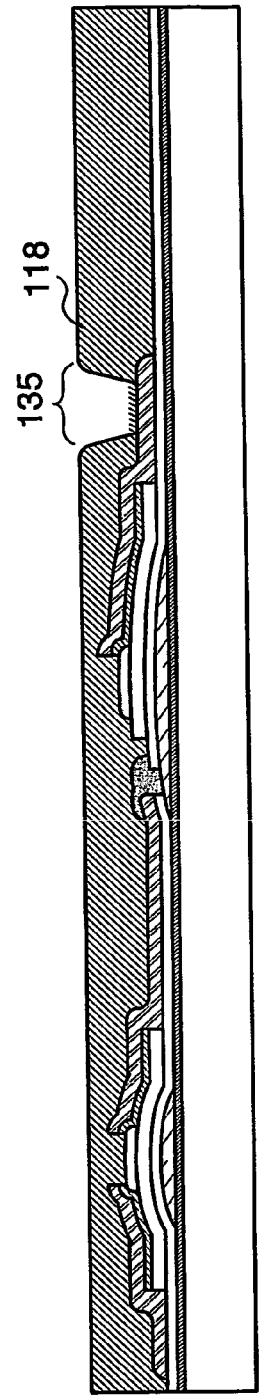

As shown in FIG. 6C, an interlayer insulating film 118 is formed. The interlayer insulating film is not formed on the liquid repellent film which is selectively formed. Thus, an opening 135 is formed.

Figure 6D:
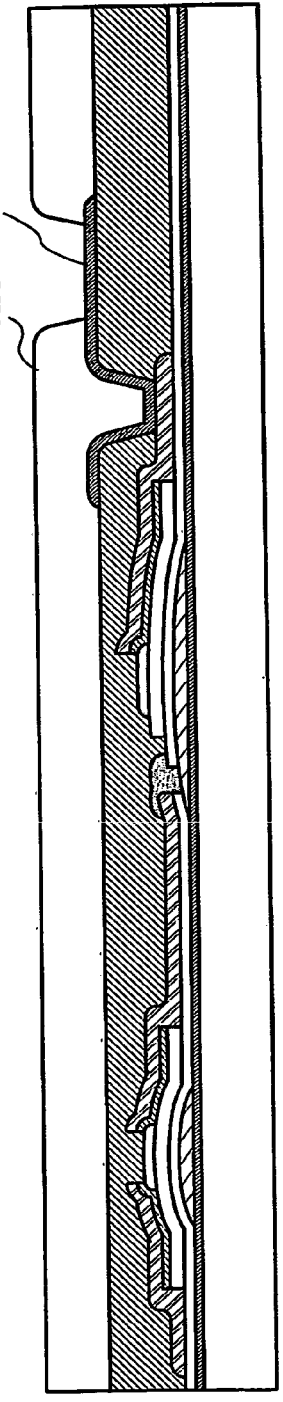

As shown in FIG. 6D, a pixel electrode 119 is formed over the opening 135, and an insulating film 120 serving as a bank or a partition may be formed so as to cover the end portion of the pixel electrode and the pixel electrode over the opening (collectively referred to as a part of the pixel electrode). Thus, a module TFT substrate can be formed.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source electrode, and a drain electrode which are made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 6

In this embodiment mode, an example of forming a first and a second thin film transistors with a method different from the above embodiment mode will be described. Specifically, the structure in which a channel protective film is not provided is different. The other structure is similar to the above embodiment mode; accordingly, the description will be omitted.

As shown in FIG. 7A, a TiOx film 101 is formed over a substrate 100 as a photocatalyst as in the above embodiment mode; a gate electrode 103 is formed in areas 11 and 12 to be provided with the first and the second thin film transistors. Further, a gate insulating film 105, a semiconductor film 106, and an n-type semiconductor film 109 are formed in order. In the case of forming the semiconductor film and the n-type semiconductor film by plasma CVD as above, the semiconductor film 106, the n-type semiconductor film 109, and the gate insulating film may preferably be formed consecutively. In this case, the films can be formed consecutively without being exposed to the atmosphere by changing the supply of the material gas.

Thereafter, a mask 111 is formed for patterning the semiconductor film 106, and the n-type semiconductor film 109 to the desired shape.

As shown in FIG. 7B, after patterning the semiconductor film and the n-type semiconductor film, an insulating film 130 is formed around the semiconductor film and the n-type semiconductor film. Note that the n-type semiconductor film needs to be connected to the source electrode and the drain electrode to be formed later. Therefore, the insulating film 130 is formed around so as to expose the n-type semiconductor film.

An organic material or an inorganic material can be used for a material of the insulating film 130. Polyimide, acrylic, polyamide, polyimideamide, benzocyclobutene, siloxane, polysilazane, or a resist material can be used as the organic material. Silicon oxide or silicon nitride may be used as the inorganic material. The insulating film 130 may be formed by ink-jet or plasma CVD.

The insulating film 130 makes the step around the semiconductor film and the n-type semiconductor film smaller, and the surface can be made smoother. Consequently, discontinuity between the source electrode and the drain electrode to be formed later can be prevented. The structure in which the insulating film 130 is formed around the semiconductor film and the n-type semiconductor film can be freely combined with other embodiment modes.

Thereafter, the n-type semiconductor film 109 is etched by using the source electrode and the drain electrode 115 as masks. The n-type semiconductor film is etched so as not to short circuit the source electrode and the drain electrode. At this point, the semiconductor film is occasionally etched in a measure.

Next, a contact hole is formed on the gate insulating film by etching, so that the source electrode or the drain electrode of a first thin film transistor is connected to the gate electrode of a second thin film transistor. A contact hole of the gate insulating film may be formed according to the embodiment mode above.

A conductive film 116 for connecting the source electrode or the drain electrode of the first thin film transistor to the gate electrode of the second thin film transistor may be formed in the contact hole. The conductive film 116 may be formed according to the embodiment mode above.

Thus, active elements which serve as a first and a second thin film transistors can be completed.

As described above, a thin film transistor in which a source electrode and a drain electrode have been provided is completed. A thin film transistor in this embodiment mode is what is called a bottom gate thin film transistor whose gate is provided below a semiconductor film. Specifically, the thin film transistor is called a channel etch type which is not provided with a channel protective film. A substrate provided with a plurality of such thin film transistors is referred to as a TFT substrate.

As shown in FIG. 7C, a columnar conductive film 117 is formed on the source electrode or the drain electrode of the second thin film transistor. Thereafter, an interlayer insulating film 118, a pixel electrode 119, and an insulating film 120 serving as a bank or a partition are formed. The columnar conductive film 117, the interlayer insulating film 118, the pixel electrode 119, and the insulating film 120 serving as a bank or a partition may be formed according to the above embodiment mode. Further, in FIG. 7C, a columnar conductive film 117, an interlayer insulating film 118, a pixel electrode 119, and the like are formed so as to correspond to Embodiment Mode 1. However, this embodiment mode can be freely combined with any one of Embodiment Modes 2 to 5. The TFT substrate of this state is referred to as a module TFT substrate.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source electrode and a drain electrode which are made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 7

In this embodiment mode, an example of forming a first and a second thin film transistors with a method different from the above embodiment mode will be described. Specifically, the thin film transistors are what are called top gate thin film transistors in each of which a gate electrode is provided above a semiconductor film. The other structure is similar to the above embodiment mode; accordingly, the description will be omitted.

Figures 8A, 8B:
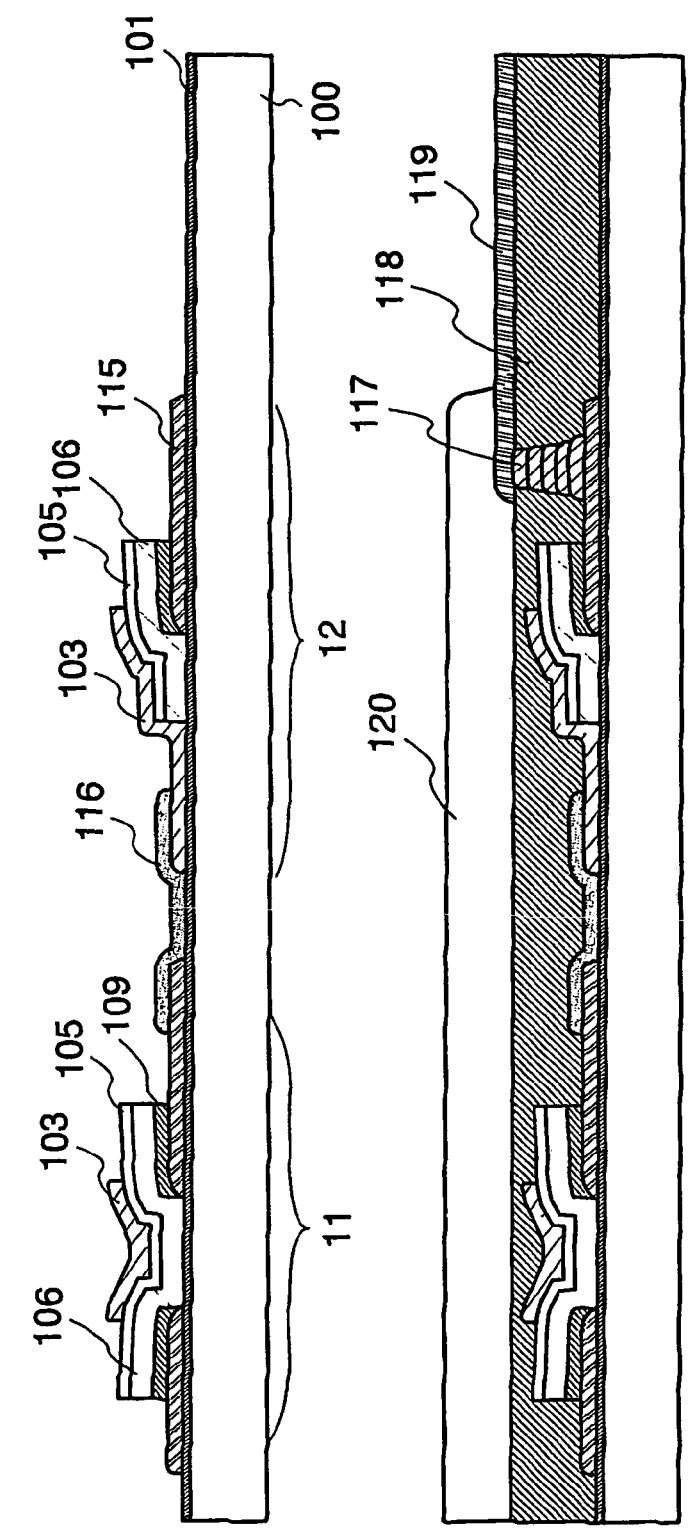
FIGS. 8A and 8B are cross sectional views showing fabrication steps of a thin film transistor of the present invention.

As shown in FIG. 8A, a TiOx film 101 is formed over a substrate 100. A base film may be formed over the substrate if necessary as above. An insulating film of such as silicon oxide, silicon nitride, silicon nitride oxide, titanium oxide, or titanium nitride may be used for the base film. In this embodiment mode, the TiOx film serves as a base film.

In regions 11 and 12 where a first and a second thin film transistors are to be formed, a source electrode and a drain electrode 115 are formed. The source electrode and the drain electrode may be formed according to the above embodiment mode. In this embodiment mode, the electrodes are formed by dropping dots containing Ag by ink-jet. Thereafter, an n-type semiconductor film 109 is formed as necessary. As a result, resistance between the source electrode and the drain electrode, and the semiconductor film is preferably decreased. In the case of forming an n-type semiconductor film, the n-type semiconductor film needs to be etched so that the source electrode and the drain electrode are not short-circuited due to the n-type semiconductor film.

A semiconductor film 106 and a gate insulating film 105 are formed in order. The semiconductor film and the gate insulating film may be formed consecutively by using different material gases. The semiconductor film and the gate insulating film may be formed according to the above embodiment mode. Thereafter, a mask is formed (not shown), and the n-type semiconductor film 109, the semiconductor film 106, and the gate insulating film 105 are patterned to the desired shape.

A gate electrode 103 is formed over the semiconductor film. The gate electrode may be formed according to the above embodiment mode. In this embodiment mode, dots containing Ag are applied by ink-jet.

It is not shown; however, a protective film may be formed over the gate electrode preferably. The protective film may be formed to have a single layer structure or a layered structure including silicon nitride, silicon oxide, and the like. For example, a protective film in which silicon nitride, silicon oxide, and silicon nitride are stacked in order may be formed. As in this embodiment mode, in the case of using Ag for the gate electrode, a silicon nitride film may be preferably used for the gate insulating film which is an insulating film in contact with Ag. This is because when an insulating film containing oxygen is used, the oxygen reacts with Ag and silver oxide is formed; thus, the surface of the gate electrode would be rough.

A conductive film 116 for connecting the source electrode or the drain electrode of the first thin film transistor to the gate electrode of the second thin film transistor is formed. The conductive film may be formed according to the above embodiment mode.

Thus, active elements which serve as a first and a second thin film transistors can be completed.

As described above, a thin film transistor in which a source electrode and a drain electrode have been provided is completed. A thin film transistor in this embodiment mode is what is called a top gate thin film transistor whose gate is provided above a semiconductor film. A substrate provided with a plurality of such thin film transistors is referred to as a TFT substrate.

As shown in FIG. 8B, a columnar conductive film 117 is formed on the source electrode or the drain electrode of the second thin film transistor. Thereafter, an interlayer insulating film 118, a pixel electrode 119, and an insulating film 120 serving as a partition or a bank are formed. The columnar conductive film 117, the interlayer insulating film 118, the pixel electrode 119, and the insulating film 120 serving as a bank or a partition may be formed according to the above embodiment mode. Further, in FIG. 8B, a columnar conductive film 117, an interlayer insulating film 118, a pixel electrode 119, and the like are formed so as to correspond to Embodiment Mode 1. However, this embodiment mode can be freely combined with any one of Embodiment Modes 2 to 5. The TFT substrate of this state is referred to as a module TFT substrate.

As to a thin film transistor shown in this embodiment mode, at least a conductive film or a mask other than the conductive film is formed by ink-jet. Accordingly, as long as ink-jet is employed in a step for forming a conductive film or a mask other than the conductive film, other conductive films may be formed by a method other than ink-jet. When ink-jet is employed for one step, efficiency in the use of material is improved and reductions in costs and the amount of liquid waste to be processed may be achieved. Especially, when a mask is formed by ink-jet, the process can be simplified in comparison with photolithography. Consequently, costs such as equipment costs, and time of manufacture can be reduced.

As thus described, a thin film transistor having a gate electrode, a source electrode and a drain electrode which are made finer by base pretreatment can be obtained. Further, in the case of selectively performing base pretreatment, wirings can be formed along the area treated with the base pretreatment even when dots are discharged out of alignment in some degree; thus, the alignment of wiring formation can be enabled.

Embodiment Mode 8

In this embodiment mode, a process of planarizing an interlayer insulating film will be described.

As shown in FIG. 9A, an interlayer insulating film 118 is formed by ink-jet or coating. A material of the interlayer insulating film may be selected according to the above embodiment mode. In this embodiment mode, siloxane is used to form the interlayer insulating film by ink-jet. Here, dots containing an organic material are applied, and the interlayer insulating film is planarized by using a means 150 for spraying gas before heating. For example, an air knife used for removing impurities of a substrate or the like may be used as the means for spraying gas. Atmospheric air, oxygen, or nitrogen may be used as the gas. Therefore, even minute irregularities on the surface of the interlayer insulating film can be planarized. After the planarization, heating is performed, and baking is to be performed.

The surface of the columnar conductor 117 may also be planarized by using the means for spraying gas. For example, after a contact hole is formed in an interlayer insulating film, when a conductive film is formed in the contact hole by ink-Jet, dots containing a conductive film material are applied; thus, the surface of the conductive film can be planarized using the means for spraying gas before heating. After the planarization, heating is performed, and baking is to be performed.

After the conductive film is formed, the conductive film is heated to the extent that the columnar shape thereof can be kept. Subsequently, before the heating, the surfaces of the conductive film and the interlayer insulating film can be planarized by using the means for spraying gas. After the planarization, heating is performed, and baking is to be performed.

Further, several dots containing a conductive film material are applied on the area to be provided with the conductive film, and an interlayer insulating film is formed. In the case where dots containing a conductive film material are made liquid repellent, an opening is formed in the interlayer insulating film over the dots. Subsequently, a columnar conductive film is formed by applying dots containing a conductive film material to the opening. Thereafter, the surfaces of the conductive film and the interlayer insulating film can be planarized by using the means for spraying gas. After the planarization, heating is performed, and baking is to be performed.

By improving the planarity of the surfaces of the conductive film and the interlayer insulating film, a multilayer wiring in which insulating films and conductive films are stacked can be formed.

In this embodiment mode, the surfaces of interlayer insulating film and the like can be planarized by using a means for spraying gas. The other structure may be freely combined with the above embodiment modes.

In FIG. 9B, a general view of the planarization process is shown. In the case where the width of the means 150 for spraying gas is larger than the width of the substrate 100 provided with an interlayer insulating film, productivity is preferably improved even in the case of a large mother glass substrate. Meanwhile, even in the case where the width of the means 150 for spraying gas is smaller than the width of the substrate 100, a large mother substrate can be planarized by multiple scanning. FIG. 9 show the case where the means for spraying gas is moved; however, any structure may be employed as long as the means for spraying gas is the substrate are moved relatively.

Such planarization process can be performed under atmospheric pressure or reduced pressure. Further, atmosphere control may be performed by using oxygen, nitrogen, a rare gas, or the like in a planarization chamber. Still further, the substrate may be heated, or the temperature of the planarization chamber may be controlled.

Figure 10:
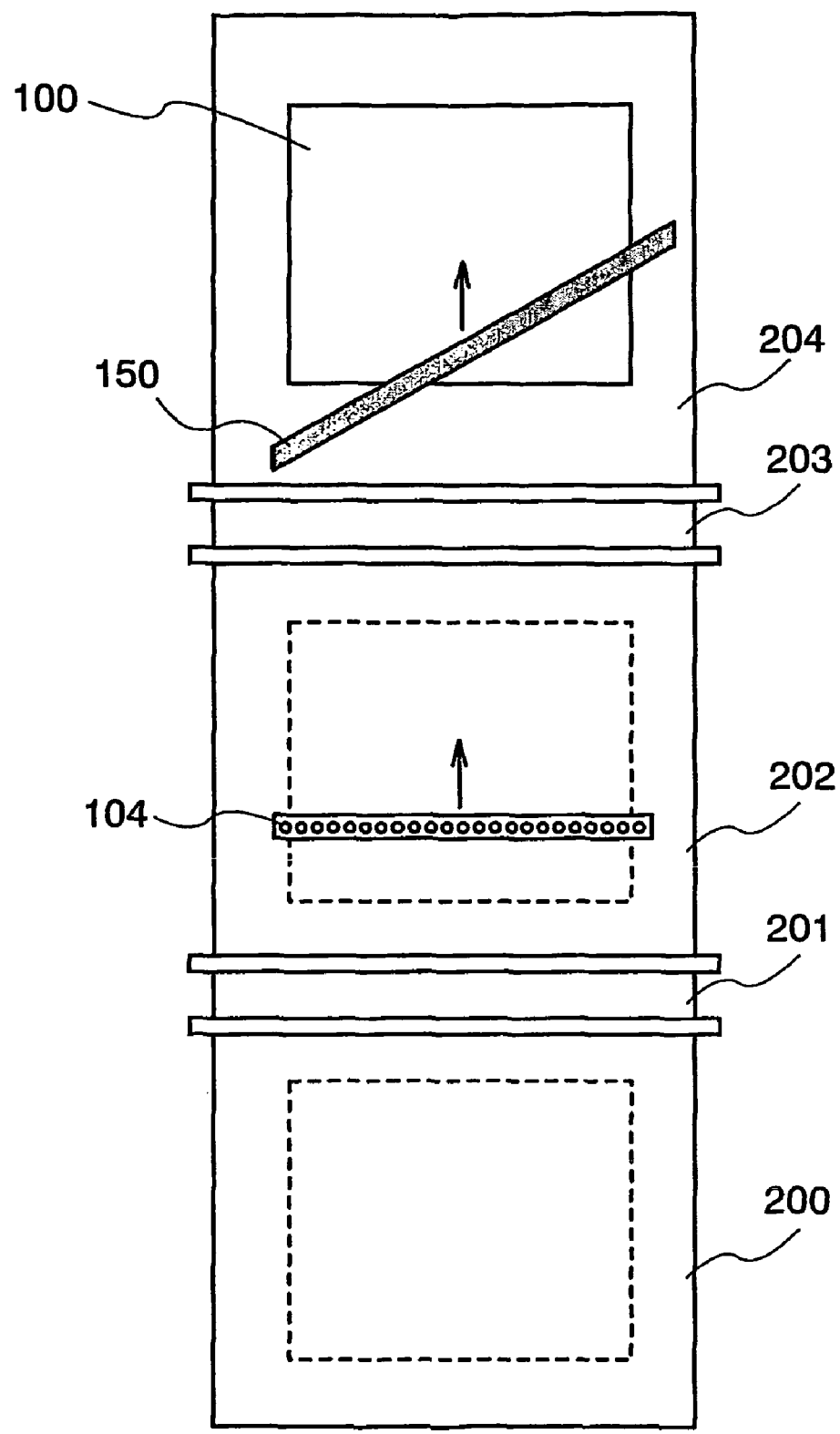
FIG. 10 is a top view showing an apparatus for forming a thin film transistor of the present invention.

In FIG. 10, an in-line manufacturing system in which a treatment chamber for applying dots by ink-jet or the like (application treatment chamber) and the planarization chamber are connected is shown.

A load chamber 200 for storing the substrate is provided with an application treatment chamber 202, in which droplets are discharged, with a transfer chamber 201 therebetween. The application treatment chamber is provided with a planarization chamber 204 with a transfer chamber 203 therebetween. The substrate 100 is transferred in order through the load chamber, the application treatment chamber, and the planarization chamber and is processed as shown in the above embodiment mode. After the planarization process, application treatment may be performed.

As a planarization chamber shown in FIG. 10, a means for spraying gas is preferably provided slantingly to the substrate. This is because the position to start planarization can be controlled.

Such a manufacturing system preferably makes it easier to transfer a substrate. Further, in the case of controlling atmosphere in the application process and the planarization process, it is preferable to use an in-line manufacturing system; thus, the treatment can be performed without exposure to the atmosphere.

Embodiment Mode 9

In this embodiment mode, the case of forming an electroluminescent layer over a module TFT substrate shown in the above embodiment modes will be described.

Figure 11A:
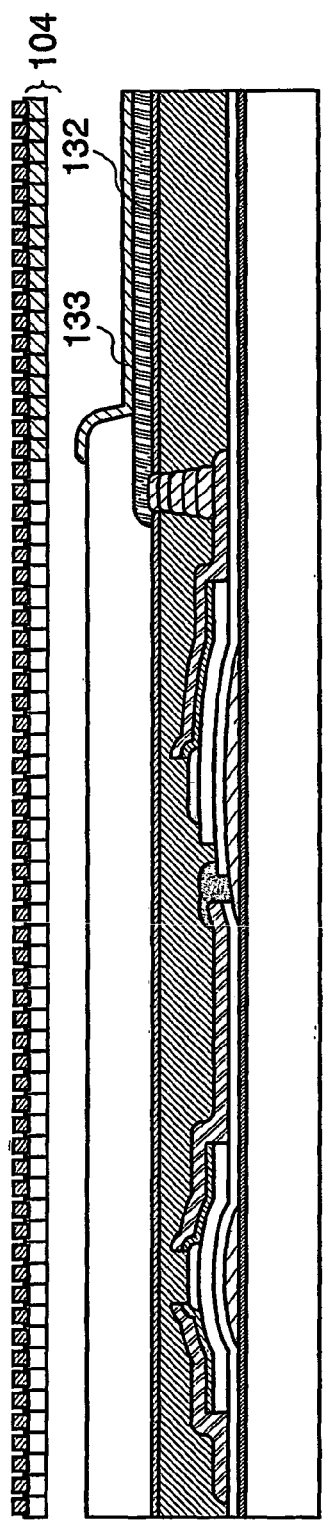
FIGS. 11A and 11B are cross sectional views showing fabrication steps of a thin film transistor of the present invention.

As shown in FIG. 11A, an opening is formed in an insulating film 120 which serves as a bank or a partition so as to expose a pixel electrode (also referred to as a first electrode of a light emitting element) 119. An end portion of the opening in the insulating film is tapered or curved. For example, in the case of forming an insulating film 120 with a positive type photosensitive acrylic, an opening having curvature on the upper portion can be formed by etching photosensitive organic resin by exposure. The tapered or curved shape of the opening prevents the electroluminescent layer or the like to be formed later from breaking.

It is preferable to perform heat treatment under atmospheric pressure or reduced pressure after forming the insulating film 120. The heat treatment may be performed at a temperature of 100° C. to 450° C., preferably, 250° C. to 350° C. Accordingly, moisture absorbed inside or on the surface of the insulating film 120 can be removed.

Note that, in this embodiment mode, NITO is used for the pixel electrode; therefore, the pixel electrode 119 is formed after a silicon nitride film 132 is formed over the interlayer insulating film.

An electroluminescent layer 133 is formed in the opening of the interlayer insulating film 120. After the heat treatment for the interlayer insulating film 120, it is preferable to form the electroluminescent layer by vacuum deposition or droplet discharge method under reduced pressure without exposure to the atmosphere. Further, the insulating film 120 may be made liquid repellent by plasma treatment before forming the electroluminescent layer. In this embodiment mode, the opening of the insulating film 120 is treated with plasma. An organic material (including a low molecular weight material and a high molecular weight material), or a composite material of an organic material and an inorganic material may be used as materials of the electroluminescent layer. The electroluminescent layer can be formed by ink-jet, coating, or deposition. A high molecular weight material may preferably be applied by ink-jet or coating. A low molecular weight material may preferably be applied by deposition, especially vacuum deposition. In this embodiment mode, a low molecular weight material is used forming the electroluminescent layer by vacuum deposition.

A singlet excited state and a triplet excited state may be used for a kind of the molecular exciton formed in an electroluminescent layer. A ground state is generally a singlet excited state, and light emission from a singlet excited state is referred to as fluorescence. Light emission from a triplet excited state is referred to as phosphorescence. Light-emission from an electroluminescent layer includes light emission by the both excited states. Further, fluorescence and phosphorescence may be combined, and either of them can be selected depending on luminescence property (such as light emitting luminance or the lifetime) of respective RGB.

Generally, the electroluminescent layer is formed by laminating HIL (hole injecting layer), HTL (hole transporting layer), EML (light emitting layer), ETL (electron transporting layer), EIL (electron injecting layer) sequentially from the side of the pixel electrode 119. Note that the electroluminescent layer can employ a single layer structure or a combined structure other than a laminated structure.

Specifically, CuPc or PEDOT for HIL, α-NPD for HTL, BCP or Alq$_3$ for ETL and BCP: Li or CaF$_2$ for EIL are used respectively. Alq$_3$ doped with a dopant corresponding to each light emission of RGB (DCM or the like for R, DMQD or the like for G) may be used for EML, for example.

Note that the electroluminescent layer is not limited to the above material. For example, hole injection characteristics can be enhanced by co-evaporating oxide such as molybdenum oxide (MoOx: x=2 to 3) and α-NPD or rubrene instead of using CuPc or PEDOT.

In this embodiment mode, materials for light emission of red (R) green (G) and blue (B) are each selectively formed by vapor deposition using a vapor-deposition mask or the like for the electroluminescent layer 141. In the case of performing ink-jet, the materials emitting light of red (R) green (G) and blue (B) can be applied without using a mask.

In the case of forming the electroluminescent layer of each RGB, high-definition display can be performed by using a color filter. This is because broad peak can be corrected to be sharp in light emitting spectrum of each RGB by the color filter.

The case of forming the electroluminescent layer of each RGB is described above; however, an electroluminescent layer of monochrome light emission may be formed. In this case, a color filter or a color conversion layer is combined to display with full color. For example, when an electroluminescent layer for light emission of white or orange is formed, a color filter, or a color filter combined with a color conversion layer may be provided to obtain a full color display. A color filter or a color conversion layer may be formed on a second substrate (sealing substrate), for example, and attached to a substrate. Both color filter and color conversion layer can be formed by ink-jet.

A display of monochrome light emission may be performed by forming an EL layer of monochrome light emission. For example, an area color display device may be formed by using monochrome light emission. A passive matrix structure is suitable for the area color type, which can mainly display characters and symbols.

Figure 11B:
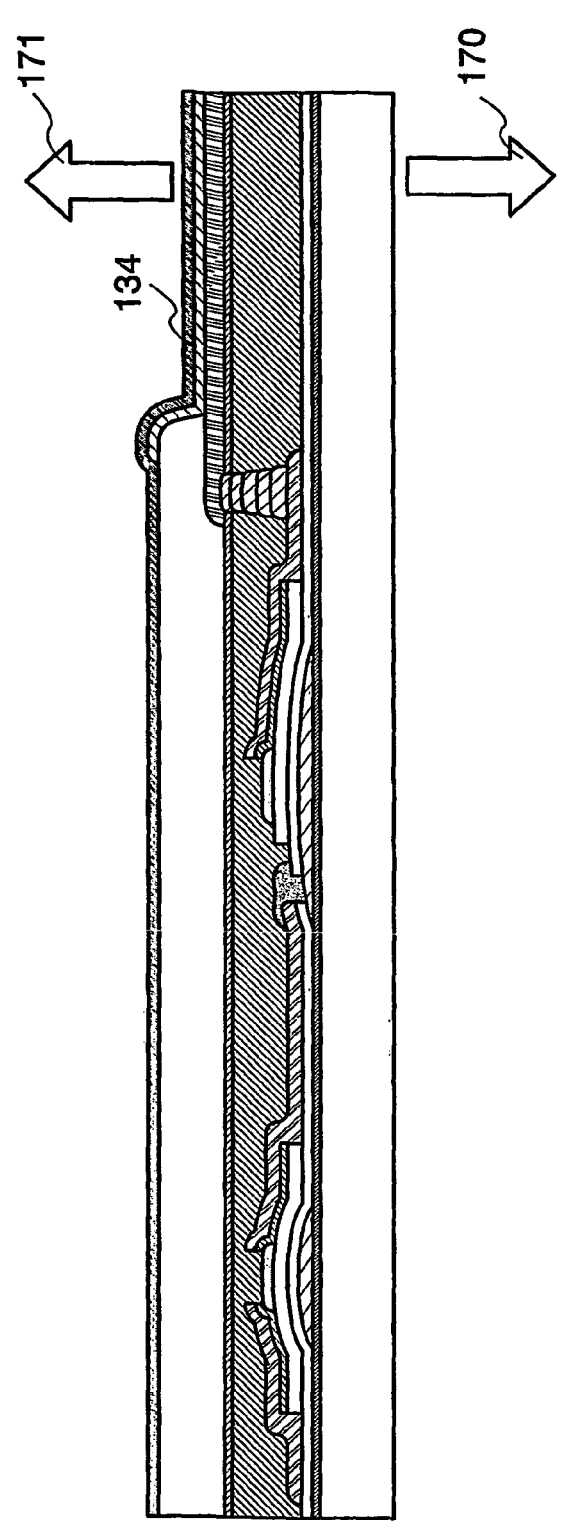

As shown in FIG. 11B, a second electrode 134 of the light emitting element is formed thereafter so as to cover the electroluminescent layer 133 and the insulating film 120.

It is necessary to select materials of the first electrode 119 and the second electrode 134 in consideration of the work function. The first electrode and the second electrode can be an anode or a cathode depending on a pixel structure. It is preferable that the first electrode is a cathode and the second electrode is an anode in this embodiment mode, since the polarity of a second thin film transistor is an n-channel type. On the contrary, it is preferable that the first electrode is an anode and the second electrode is a cathode when the polarity of the second thin film transistor is a p-channel type.

Hereinafter, electrode materials used for the anode and the cathode will be described.

It is preferable to use a metal, an alloy, a conductive compound, a mixture thereof, or the like having a high work function (work function: 4.0 eV or more) as an electrode material used for the anode. ITO (indium tin oxide), IZO (indium zinc oxide) in which zinc oxide (ZnO) of 2% to 20% is mixed into indium oxide, ITSO (NITO), gold, platinum, nickel, tungsten, chromium, molybdenum, iron, cobalt, copper, palladium, a nitride of a metal material (such as titanium nitride) and the like can be cited as a specific material.

Meanwhile, it is preferable to use a metal, an alloy, a conductive compound, a mixture thereof, or the like having a low work function (work function: 3.8 eV or less) as an electrode material used for the cathode. An element belonging to Group 1 or 2 in the periodic table, that is, an alkaline metal such as lithium or cesium, an alkaline earth metal such as magnesium, calcium, or strontium, an alloy (Mg:Ag or Al:Li) or a compound (LiF, CsF, or $CaF_2$) including them, or a transition metal including a rare-earth metal can be cited as the specific material.

The cathode can be formed by extremely thinly forming such a metal or an alloy including such a metal and by laminating ITO, IZO, ITSO, or another metal (including an alloy) thereover, in the case where the cathode is required to transmit light in this embodiment mode.

The direction of light emitted from the electroluminescent layer can be selected by using a light transmitting or a non-light transmitting anode material or cathode material for the first electrode or the second electrode. For example, in the case of forming the first electrode and the second electrode with a light transmitting material, dual emission display in which light from the electroluminescent layer is emitted to the side of the substrate 170 and to the side of the sealing substrate 171 can be performed. On this occasion, light can be efficiently utilized by using a highly reflective conductive film for the non-light transmitting electrode provided on a side which is not a light emitting direction.

The first electrode and the second electrode can be formed by vapor deposition, sputtering, ink-jet, or the like.

In the case of forming the second electrode with ITO or ITSO, or a stack thereof by sputtering, the electroluminescent layer may be damaged due to sputtering. In order to reduce damages due to the sputtering, an oxide such as molybdenum oxide (MoOx: x=2 to 3) is preferably formed on the top surface of the electroluminescent layer. Therefore, oxide such as molybdenum oxide (MoOx: x=2 to 3) or titanium oxide (TiOx) which functions as HIL or the like is formed on the top surface of the electroluminescent layer. An EIL (electron injecting layer), an ETL (electron transporting layer), an EML (light emitting layer), an HTL (hole transporting layer), an HIL (hole injecting layer), and the second electrode may be laminated in this order from the side of the first electrode. In other words, an electroluminescent layer including both organic material and inorganic material may be formed. At this time, the first electrode functions as a cathode and the second electrode functions as an anode.

Since the polarity of the second thin film transistor is an n-channel type in this embodiment mode, it is preferable to employ a structure of the first electrode that is a cathode, EIL (electron injecting layer), ETL (electron transporting layer), EML (light emitting layer); HTL (hole transporting layer), HIL (hole injecting layer), and the second electrode that is an anode in consideration of a moving direction of an electron.

In this embodiment mode, high planarity is achieved due to the interlayer insulating film, and preferably, uniform voltage can be applied to the electroluminescent layer.

Thereafter, an insulating film containing nitrogen, a carbon film containing nitrogen (CNx), a DLC film, or the like may be formed by sputtering or CVD as a protective film over the second electrode. Further, a film formed of an organic material such as styrene polymer may be formed over the film containing the above inorganic material. Thus, the penetration of moisture and oxygen can be prevented. In particular, when NITO is used for the second electrode, a silicon nitride film may preferably be formed and used as a protective film. Further, sides of a display area may be covered with the first electrode, the second electrode, and another electrode, thereby preventing oxygen and moisture from penetrating.

Figure 12A:
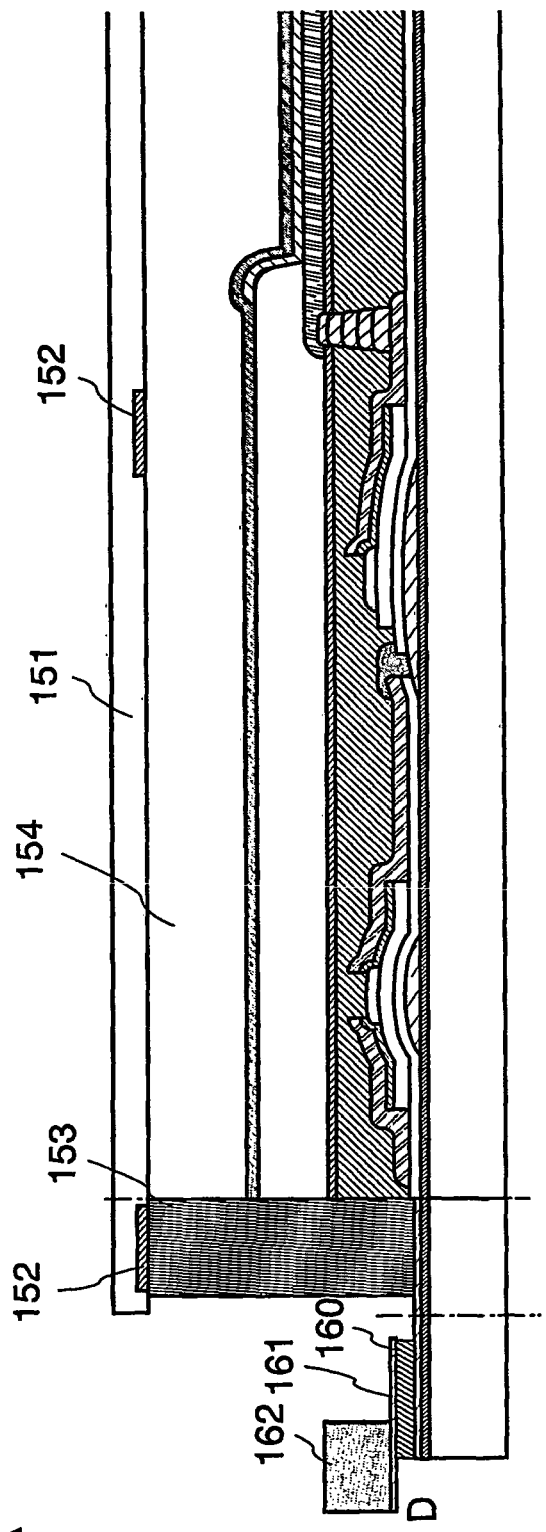
FIGS. 12A and 12B are cross sectional views showing fabrication steps of a thin film transistor of the present invention.
Figure 12B:
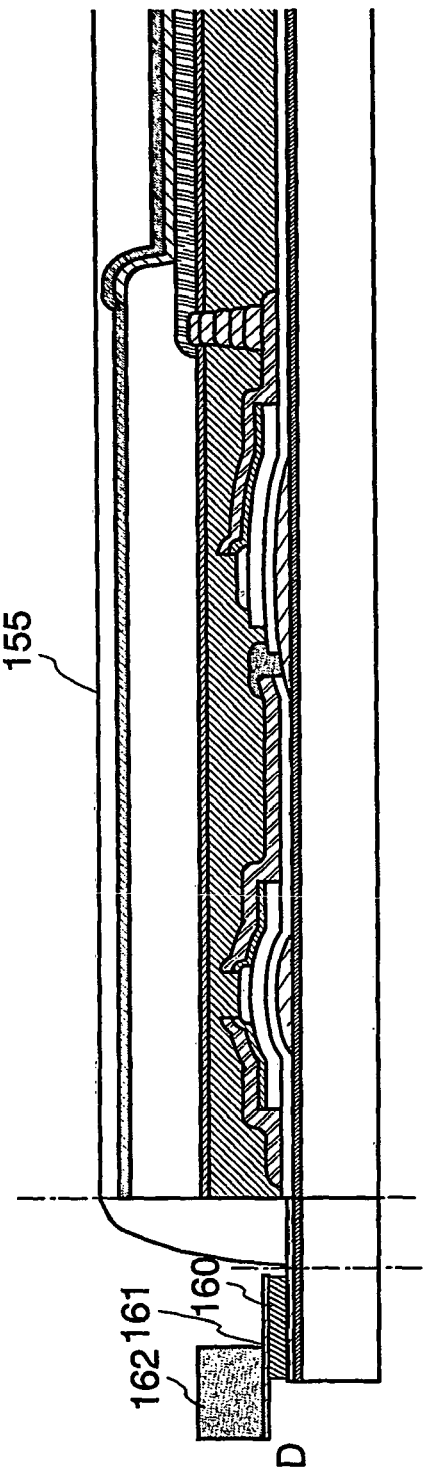

Thereafter, as shown in FIG. 12A, a sealing substrate 151 is attached to the substrate using a sealant 153. A space 154 formed between the substrate and the sealing substrate, may be filled with nitrogen, or may be provided with a desiccant. Further, the space may be filled with a light transmitting resin which is highly water absorbent. In this embodiment mode, a hollow is formed on the sealing substrate 151 and the hollow is filled with a desiccant 152. The upper part of the insulating film 120 may be provided with the desiccant so as not to shield light from the electroluminescent layer. Further, the desiccant may be provided in the upper part of the sealant. Consequently, oxygen and moisture can be prevented from penetrating the sealant.

Thus, a light emitting module can be completed.

Wirings over the substrate can be connected to an external terminal 162 provided outside the sealant by bonding FPC (flexible printed circuit) 161 using an anisotropic conductive film 160. The external terminal is formed from a signal line driver circuit or a scan line driver circuit which is an integrated circuit including an IC chip or a crystalline semiconductor film. In this embodiment mode, in the case of using a microcrystalline semiconductor for a material of the semiconductor film, a scan line drive circuit, or a selector circuit (an analog switch) forming a part of the circuit, and the like can be formed over one substrate. In the case of using a crystalline semiconductor film, a scan line driver circuit and a signal line driver circuit can be formed over one substrate. A signal line driver circuit or a scan line driver circuit may be connected to the pixel area respectively.

Thus, a light emitting device in which an external terminal is connected to a light emitting module can be fabricated.

Embodiment Mode 10

In this embodiment mode, a pixel circuit and the behavior thereof will be described.

Figure 13A:
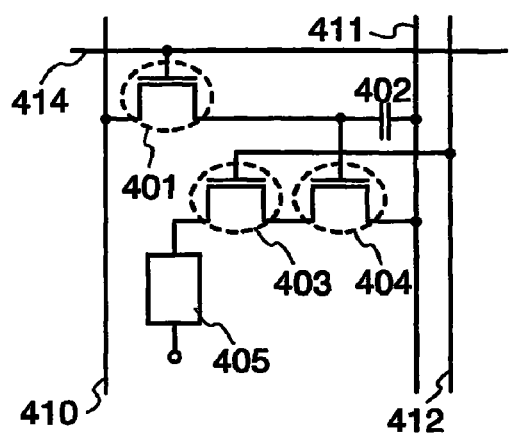
FIGS. 13A to 13F are circuit diagrams showing a pixel circuit of a display device of the present invention.

In a pixel shown in FIG. 13A, a signal line 410 and power supply lines 411 and 412 are arranged in columns, and a scan line 414 is arranged in a row. The pixel further includes a switching TFT 401, a driving TFT 403, a current control TFT 404, a capacitor 402, and a light emitting element 405.

Figure 13B:
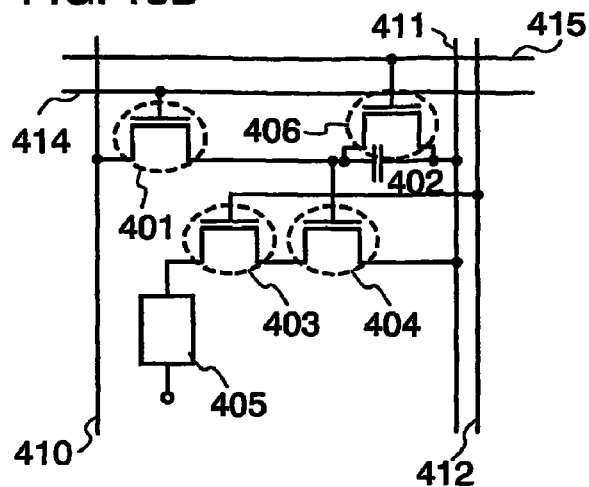
Figure 13C:
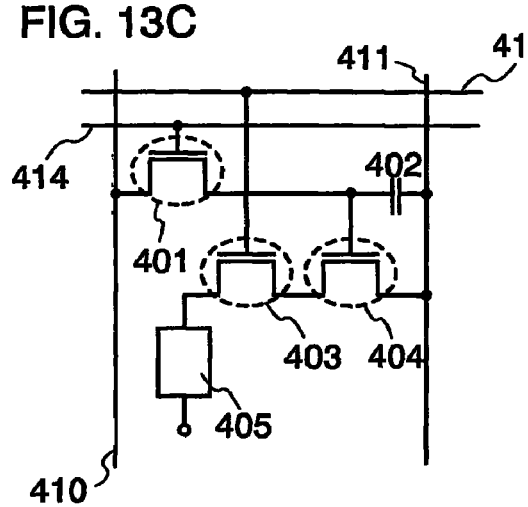
Figure 13D:
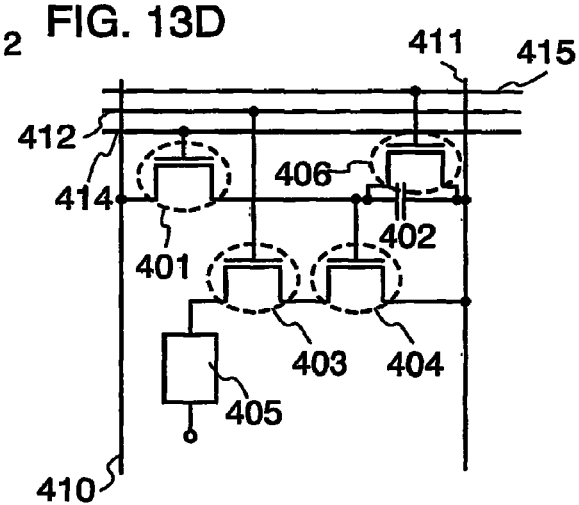

A pixel shown in FIG. 13C has the same configuration as the one shown in FIG. 13A, except that a gate electrode of a driving TFT 403 is connected to a power supply line 412 arranged in a column. That is, FIGS. 13A and 13C show equivalent circuit diagrams. However, the power supply lines are formed on different conductive layers between the cases where the power supply line 412 is arranged in a column (FIG. 13A) and where the power supply line 412 is arranged in a row (FIG. 13C). The two pixels are each shown in FIGS. 13A and 13C in order to make a clear distinction that wirings connected to the gate electrodes of the driving TFTs 403 in FIG. 13A and FIG. 13C are in different layers.

In each FIGS. 13A and 13C, the driving TFT 403 and the current control TFT 404 are connected in series in the pixel, and the ratio of the channel length L (403)/the channel width W (403) of the driving TFT 403 to the channel length L (404)/the channel width W (404) of the current control TFT 404 may be set as L (403)/W (403):L (404)/W (404)=5000 to 6000:1.

The driving TFT 403 is operated in a saturation region and controls the amount of current flowing in the light emitting element 405, whereas the current control TFT 404 is operated in a linear region and controls whether a current is supplied to the light emitting element 405 or not. The driving TFT 403 and the current control TFT 404 preferably have the same conductivity in view of the manufacturing step. The transistors are n-channel type in this embodiment mode. For the driving TFT 403, a depletion mode transistor may be used instead of an enhancement mode transistor. According to the invention having the aforementioned configuration, slight variation in Vgs of the current control TFT 404 does not affect the amount of current flowing in the light emitting element 405, since the current control TFT 404 is operated in a linear region. Accordingly, the amount of current flowing in the light emitting element 405 can be determined by the driving TFT 403 operated in a saturation region. With the above structure, it is possible to provide a display device in which variations in luminance due to variations in characteristics of TFTs are reduced and image quality is improved.

The switching TFT 401 in FIGS. 13A to 13D controls a video signal input to the pixel. When switching TFT 401 is turned ON, a video signal is inputted to the pixel. The voltage of the video signal is held in the capacitor 402. Although the pixel includes the capacitor 402 in FIGS. 13A and 13C, the invention is not limited to this. When a gate capacitance or the like can replace the capacitor in holding a video signal, the capacitor 402 is not necessarily provided.

A pixel shown in FIG. 13B has a similar configuration as that shown in FIG. 13A, except that an erase TFT 406 for discharging stored charge and a scan line 415 are added. Similarly, a pixel shown in FIG. 13D has the same configuration as that shown in FIG. 13C, except that the erase TFT 406 and the scan line 415 are added.

The erase TFT 406 is controlled to be ON/OFF by the added scan line 415. When the erase TFT 406 is turned ON, charges held in the capacitor 402 are discharged, thereby turning the current control TFT 404 OFF. That is, supply of current to the light emitting element 405 can be forcibly stopped by disposing the erase transistor 406. That is the reason why the erase TFT 406 is called an erase transistor. Accordingly, by adopting the configurations shown in FIGS. 13B and 13D, a lighting period can start simultaneously with or shortly after a writing period before signals are written to all the pixels; thus, the duty ratio can be improved.

Figure 13E:
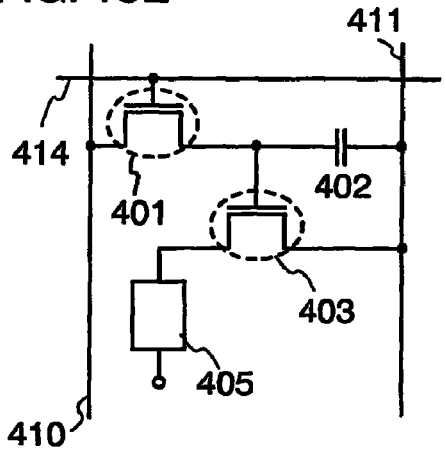
Figure 13F:
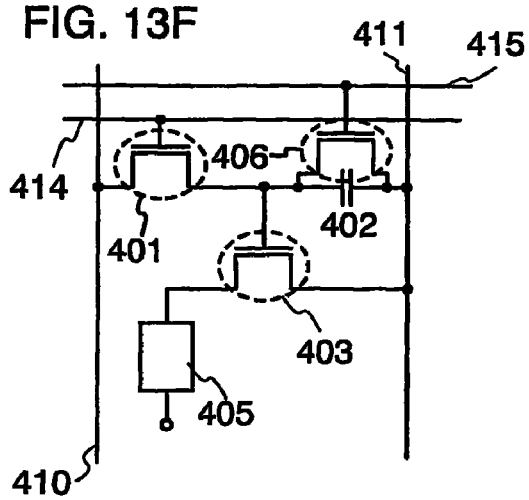

In a pixel shown in FIG. 13E, a signal line 410, and a power supply line 411 are arranged in columns. A scan line 414 is arranged in a row. The pixel further includes a switching TFT 401, a driving TFT 403, a capacitor 402, and a light emitting element 405. A pixel shown in FIG. 13F has a similar configuration as that shown in FIG. 13E, except that an erase TFT 406 and a scan line 415 are added. It is to be noted that the configuration of FIG. 13F also allows the duty ratio to be increased by disposing the erase transistor 406.

As described above, diverse pixel circuits may be adopted. In particular, in the case where a thin film transistor is formed with an amorphous semiconductor film, it is preferable to form a large semiconductor film for the driving TFT. Therefore, as to the above pixel circuit, a top emission type in which light from the electroluminescent layer is released through the sealing substrate is preferable.

In the case where pixel density is increased, such an active matrix light emitting device is considered to have an advantage over low voltage driving since each pixel is provided with a TFT.

In this embodiment mode, an active matrix light emitting device in which each pixel is provided with each TFT is described; however, a passive matrix light emitting device in which a TFT is provided every line can also be formed. The passive matrix light emitting device has a high aperture ratio since each pixel is not provided with a TFT. Therefore, light transmittance is increased when the passive matrix display device is used in the case of a light emitting device which emits light to both sides of the electroluminescent layer.

Embodiment Mode 11

In this embodiment mode, a top view of an equivalent circuit diagram shown in FIG. 13E will be described.

In this embodiment mode, a first and a second thin film transistors are bottom gate type. A contact hole is formed in a gate insulating film by dry etching using the source electrode and the drain electrode of the first thin film transistor, thereby connecting the source electrode or the drain electrode of the first thin film transistor to the gate electrode of the second thin film transistor. Other methods of forming the thin film transistor can be carried out in reference to the above embodiment modes; accordingly, the detailed description will be omitted.

Figure 14:
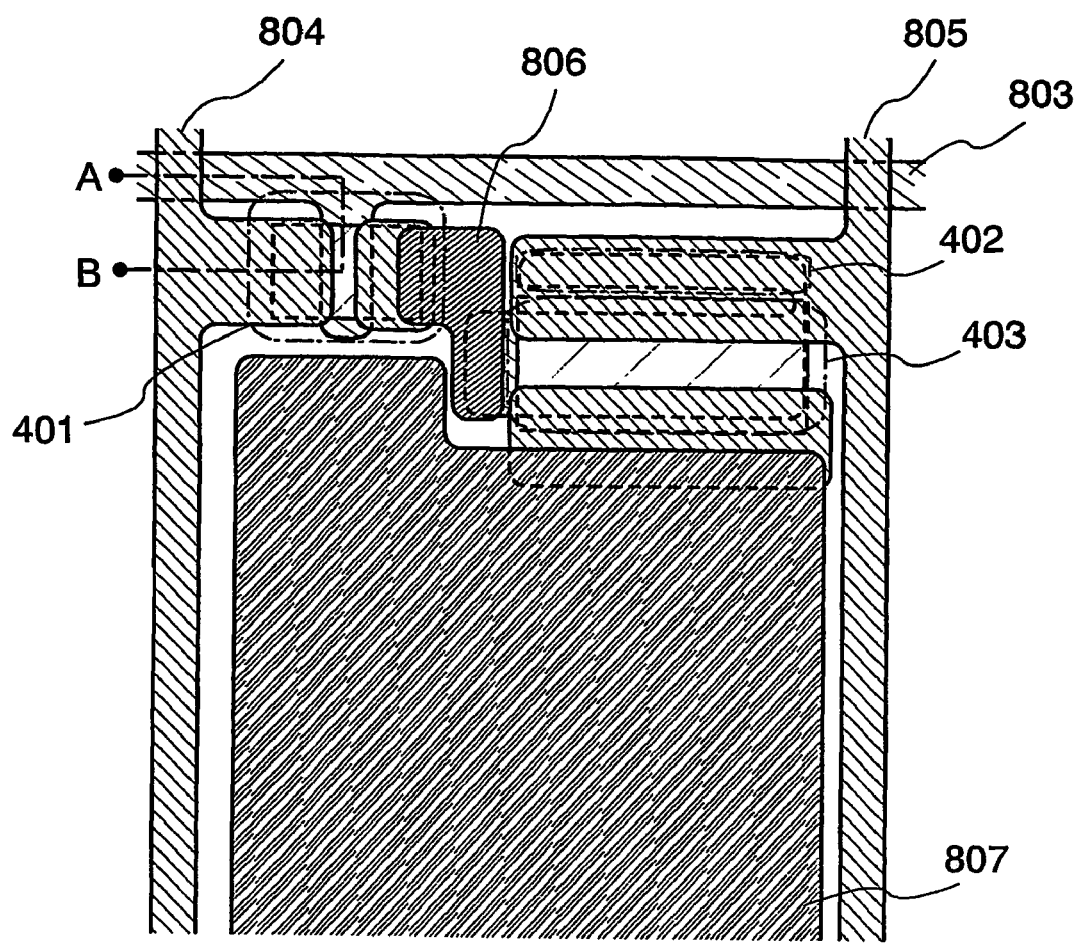
FIG. 14 is a top view showing a pixel of a display device of the present invention.

As shown in FIG. 14, a switching TFT 401, a gate electrode of a driving TFT 403, and a scan line 803 are formed in one layer over a TiOx film by ink-jet or sputtering. In the case of forming the gate electrode and the like by ink-jet, the adhesion can be improved with the TiOx film.

It is not shown; however, the switching TFT 401, a gate insulating film of the driving TFT 403, a semiconductor film, and an n-type semiconductor film are formed in order and thereafter patterned to the desired shape.

A switching TFT 401, a source electrode and a drain electrode of the driving TFT 403, a signal line 804, and a power supply line 805 are formed in one layer by ink-jet or sputtering. In the case of forming the source electrode and the drain electrode, or the like by ink-jet, the adhesion can be improved by base pretreatment.

Thereafter, an n-type semiconductor film is etched by using the source electrode and the drain electrode.

The gate insulating film is etched by using the source electrode and the drain electrode, the signal line 804, and the power supply line 805. Accordingly, the gate electrode of the driving TFT is exposed; thus, the gate electrode can be connected to the source electrode or the drain electrode of the switching TFT with a conductive film 806. The conductive film can be formed by ink-jet.

Next, a pixel electrode is formed so as to be connected to the source electrode or the drain electrode of the driving TFT. In this embodiment mode, a pixel electrode 807 is formed by ink-jet using NITO.

The capacitor 402 is formed with the conductive film formed in the same layer as the gate electrode of the driving TFT, the gate insulating film, and the conductive film in the same layer as the power supply line.

In this embodiment mode, the driving transistor includes an amorphous semiconductor film; accordingly, the channel width of the driving TFT may be preferably set large.

Figure 15A:
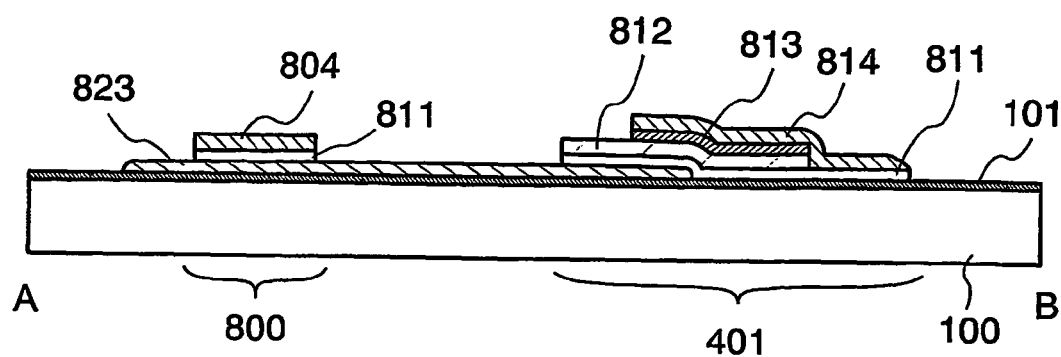
FIGS. 15A and 15B are cross sectional views each showing a pixel of a display device of the present invention.

FIG. 15A shows a cross-sectional view corresponding to A-B in FIG. 14.

A TiOx film 101 is provided over a substrate 100. A conductive film serving as a gate electrode 823 and a scan line 803 is provided over the area of the TiOx film to be provided with the switching TFT 401 and over an intersection area 800 where the scan line and the signal line are crossed.

Further, a gate insulating film 811, a semiconductor film 812, and an n-type semiconductor film 813 which are patterned to the desired shape are stacked in order.

A conductive film serving as the signal line 804, the source electrode and drain electrode 814 is formed over the gate insulating film in the area to be provided with the switching TFT 401 and the intersection area 800 where the scan line and the signal line are crossed.

Figure 15B:
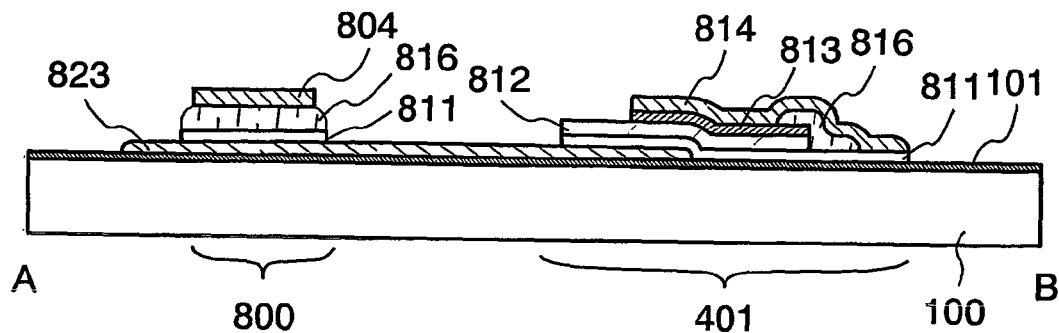

Unlike FIG. 15A, an insulating film 816 is formed before a signal line 804, a source electrode and the drain electrode 814 are formed as shown in FIG. 15B. The insulating film may be formed by ink-jet, and may be provided over a scan line 803 in an intersection area 800, and around the semiconductor film and the n-type semiconductor film. Short-circuit between the signal line and the scan line can be avoided by forming the insulating film 816 over the scan line 803. Further, the source electrode and the drain electrode 814 can be prevented from breaking by providing the insulating film 816 around the semiconductor film and the n-type semiconductor film.

Next, a top view of the case where a top gate thin film transistor is used is shown.

Figure 16:
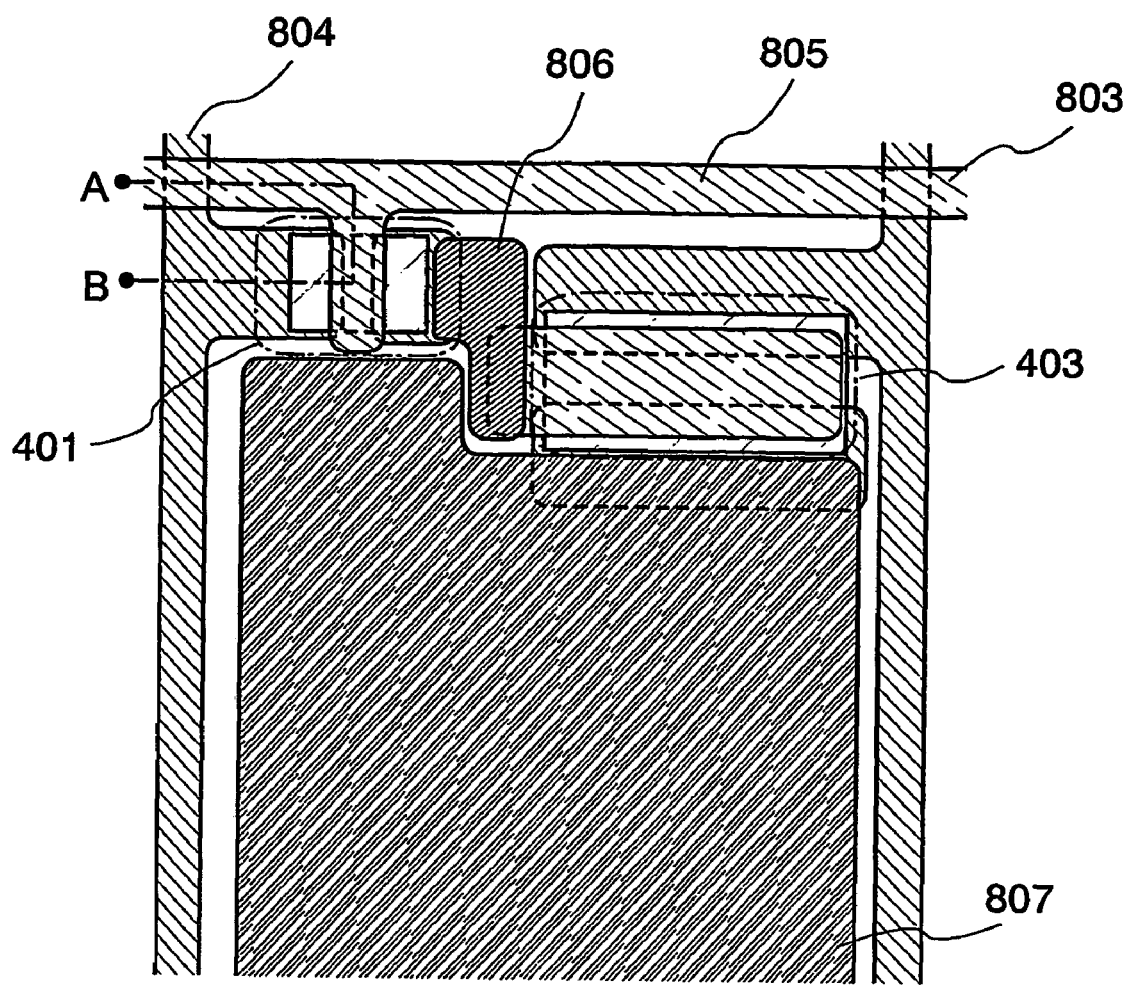
FIG. 16 is a top view showing a pixel of a display device of the present invention.

Unlike FIG. 14, the source electrode and the drain electrode of the switching TFT 401, the signal line 804, and the power supply line 805 are first formed in one layer as shown in FIG. 16. In this embodiment mode, the source electrode and the drain electrode, the signal line 804, and the power supply line 805 are formed by ink-jet. In the case of forming the source electrode, the drain electrode, and the like by ink-jet, the adhesion can be improved by base pretreatment.

Thereafter, a semiconductor film and a gate insulating film are formed in order and patterned to the desired shape. Further, an n-type semiconductor film may be formed at the interface between the source electrode and the drain electrode, and the semiconductor film as necessary.

Then, each gate electrode of the switching TFT 401 and the driving TFT 403, and the scan line 803 are formed in one layer. In this embodiment mode, the gate electrodes and the scan line 803 are formed by ink-jet. In the case of forming a gate electrode and the like by ink-jet, the adhesion can be improved by base pretreatment.

The gate electrode of the driving TFT 403 is connected to the source electrode or the drain electrode of the switching TFT with the conductive film 806. The conductive film can be formed by ink-jet.

Next, a pixel electrode is formed so as to be connected to the source electrode or the drain electrode of the driving TFT 403. In this embodiment mode, a pixel electrode 807 is formed by ink-jet using NITO.

Note that a capacitor is not provided in FIG. 16; however, a capacitor may be provided as in FIG. 14.

In this embodiment mode, the driving transistor includes an amorphous semiconductor film; accordingly, the channel width of the driving TFT may be preferably set large.

Figure 17A:
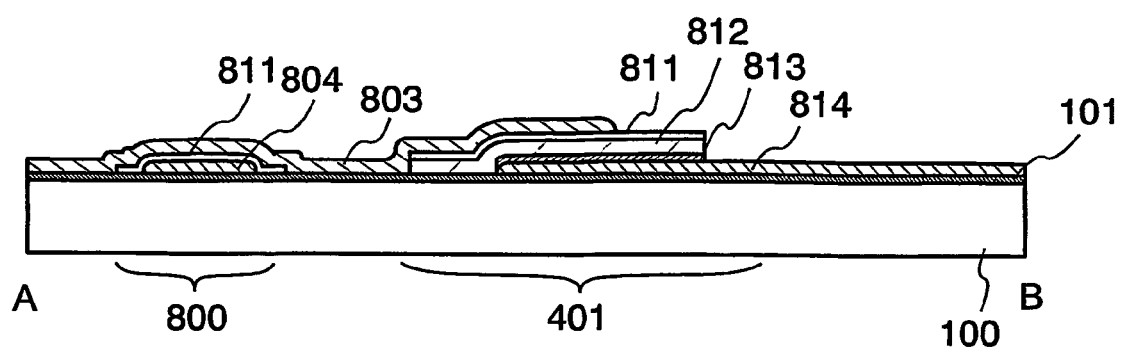
FIGS. 17A and 17B are cross sectional views each showing a pixel of a display device of the present invention.

FIG. 17A shows a cross-sectional view of A-B in FIG. 16.

A TiOx film 101 is provided over the substrate 100. The TiOx film may serve as a base film. A conductive film including the source electrode and the drain electrode 814 is provided over the area of the TiOx film to be provided with the switching TFT 401 and the driving TFT 403.

An n-type semiconductor film 813 patterned to the desired shape, the semiconductor film 812, a gate insulating film 811 are stacked in order. The n-type semiconductor film is not necessarily provided.

The scan line 803 and a conductive film serving as the gate electrode are formed over the gate insulating film in the area to be provided with the switching TFT 401 and the intersection area 800 where the scan line and the signal line are crossed.

Figure 17B:
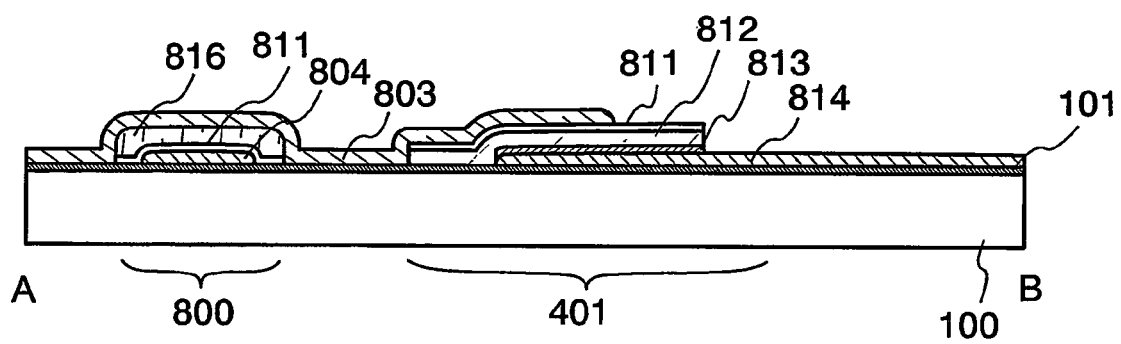

Unlike FIG. 17A, an insulating film 816 is formed before the scan line 803, and the gate electrode are formed as shown in FIG. 17B. The insulating film can be formed by ink-jet, and can be provided the intersection area or around the semiconductor film and the n-type semiconductor film. Short-circuit between the scan line and the signal line can be avoided by forming the insulating film 816 in the intersection area. Further, the source electrode and the drain electrode 814 can be prevented from breaking by providing the insulating film 816 around the semiconductor film and the n-type semiconductor film.

Embodiment Mode 12

In this embodiment mode, the case where a scan line and a signal line are provided with diodes as a protective circuit will be described by using an equivalent circuit shown in FIG. 13E.

Figure 21:
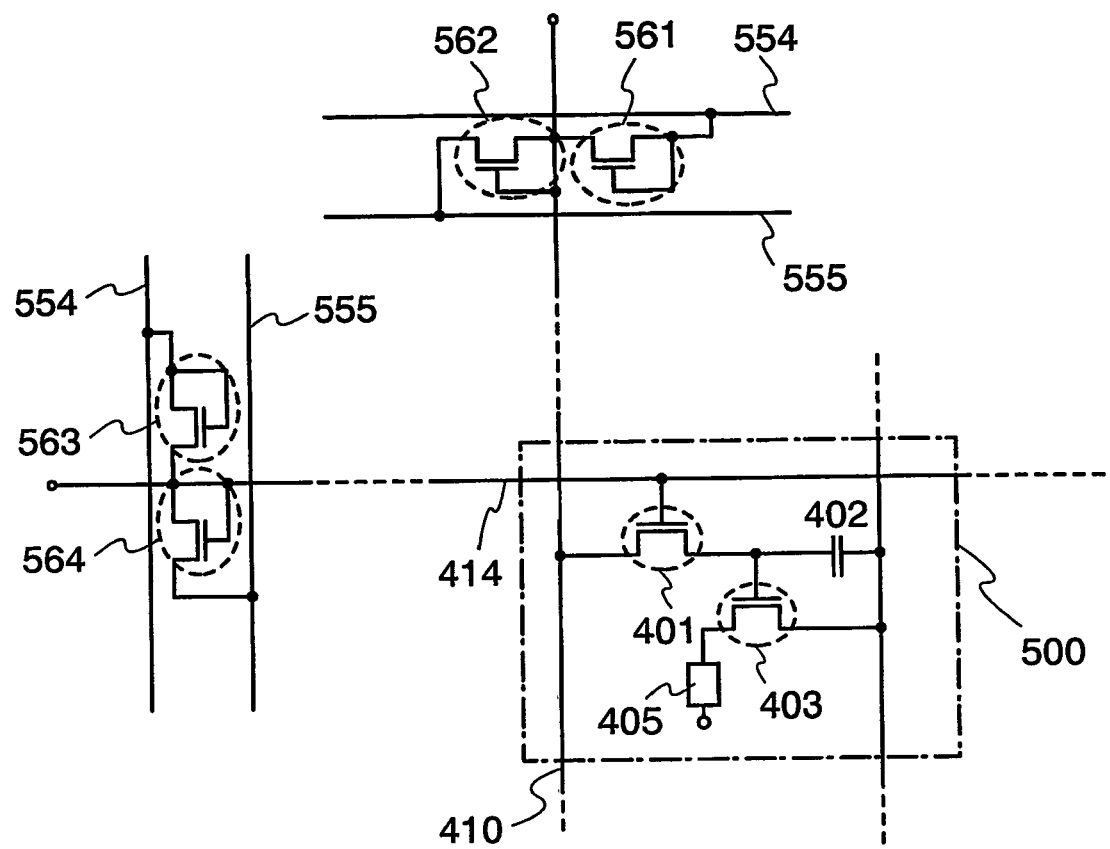
FIG. 21 is a circuit diagram showing a protective circuit of a pixel of a display device of the present invention.

In FIG. 21, a switching TFT 401, a driving TFT 403, a capacitor 402, a light emitting element 405 are provided in a pixel portion 500. A signal line 410 is provided with diodes 561 and 562. The diodes 561 and 562 are formed according to the above embodiment mode as with the switching TFT 401 or the driving TFT 403; each diode has a gate electrode, a semiconductor layer, a source electrode, a drain electrode, and the like. The diodes 561 and 562 are operated as diodes by connecting the gate electrode to the drain electrode or source electrode.

Wirings 554 and 555 connecting to the diodes are formed in the same layer as the gate electrode. Accordingly, contact holes are required to be formed in the gate insulating layer in order to connect the wirings 554 and 555 to the source electrode or the drain electrode of each diode.

The contact hole in the gate insulating film may be formed by etching using a mask formed by ink-jet. In this case, local discharge processing can be performed if atmospheric pressure discharge etching is adopted; thus, the mask is not required to be formed over the entire surface of the substrate.

The diode provided for the scan line 414 may have a similar structure.

According to the present invention as described above, diodes can be formed concurrently with a TFT of the pixel portion. Further, the location of the diodes is not limited to this embodiment mode, and the diodes may be formed between a driver circuit and a pixel.

Embodiment Mode 13

In this embodiment mode, a droplet discharge system will be described.

Figure 18:
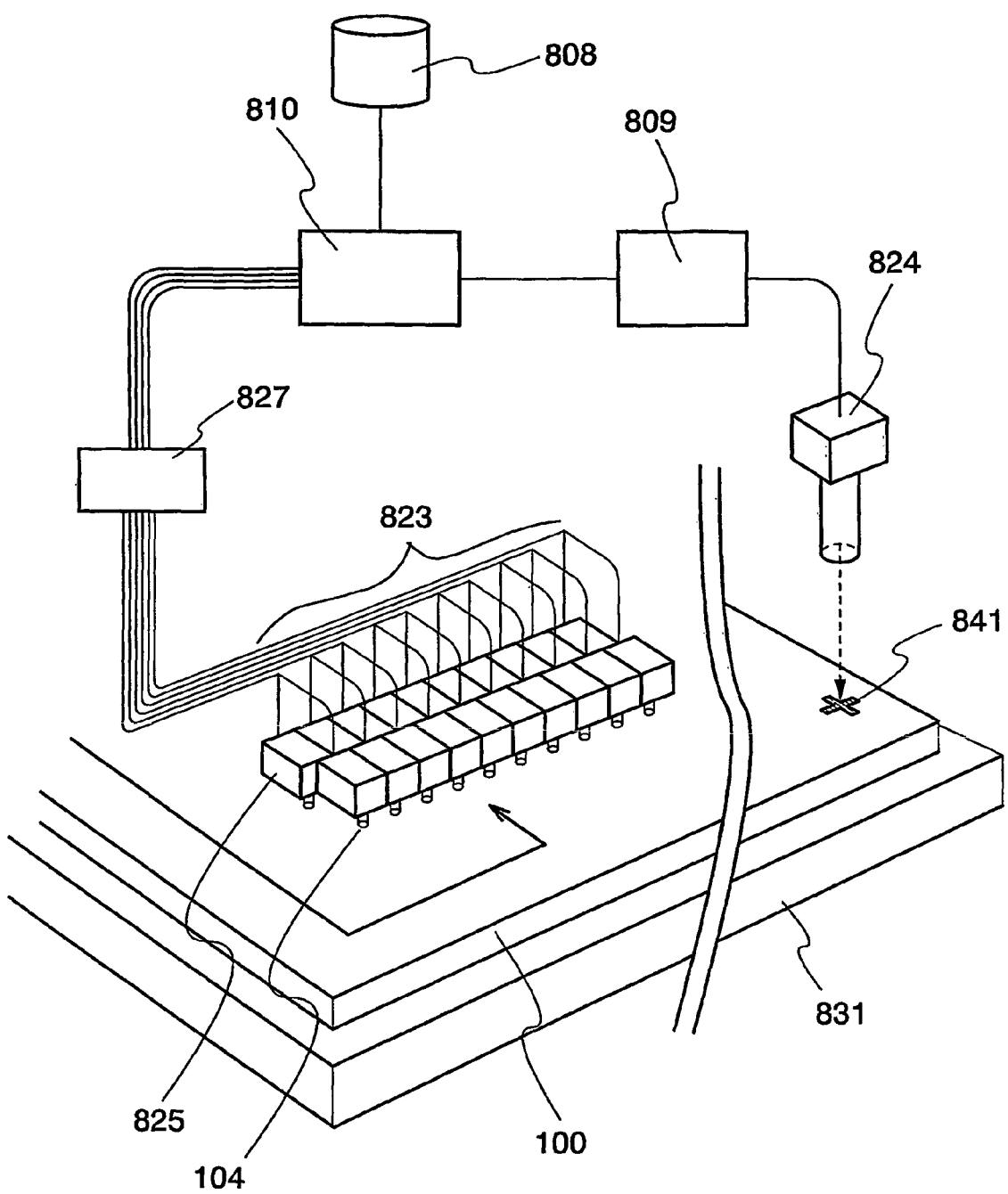
FIG. 18 is a view showing a droplet discharge system of the present invention.

In FIG. 18, a mode of a droplet discharge system used for forming patterns of such as a wiring is shown. A droplet discharge means 823 has a head 825, and the head 825 has a plurality of nozzles 104. In this embodiment mode, the case of using a droplet discharge means provided with two heads each having 10 nozzles will be described. The head 825 is connected to a control means 827, and the control means is controlled by a computer 810; thus, a predetermined pattern can be formed. The patterning may be carried out from a starting point, for example, from a marker 841 formed over a substrate 100 secured on a stage 831 or the like. Alternatively, the patterning may be carried out from using the edge of the substrate 100 as a starting point. The starting point is detected with an imaging means 824 such as a CCD, and the information is converted into a digital signal by an image processing means 809. The converted digital signal is recognized by the computer 810, and a control signal is generated and transmitted to the control means 827. Hereupon, the information of the pattern formed over the substrate 100 is stored in a storage medium 808. The control signal is sent to the control means 827 based on the information; thus, each head 825 of the droplet discharge means 823; further, each nozzle of the heads can be controlled individually.

Since the nozzles can be controlled severally, dots containing different materials can be applied by certain nozzles. For example, a nozzle for applying dots containing a conductive material and a nozzle for applying dots containing an insulating film material can be provided in one head. Further, in the case of application on a large area of such as an interlayer insulating film, dots containing an insulating film material may be dropped from all the nozzles in order to improve throughput.

The width of the whole droplet discharge means 823 is almost equal to or less than the width of the substrate 100. In particular, in the case of using a large mother glass substrate, it is considered that the width of the whole droplet discharge means 823 is smaller than the width of the mother glass substrate. Here, a pattern can be formed on the large mother glass substrate by relatively scanning the head and the substrate more than once.

Figure 26:
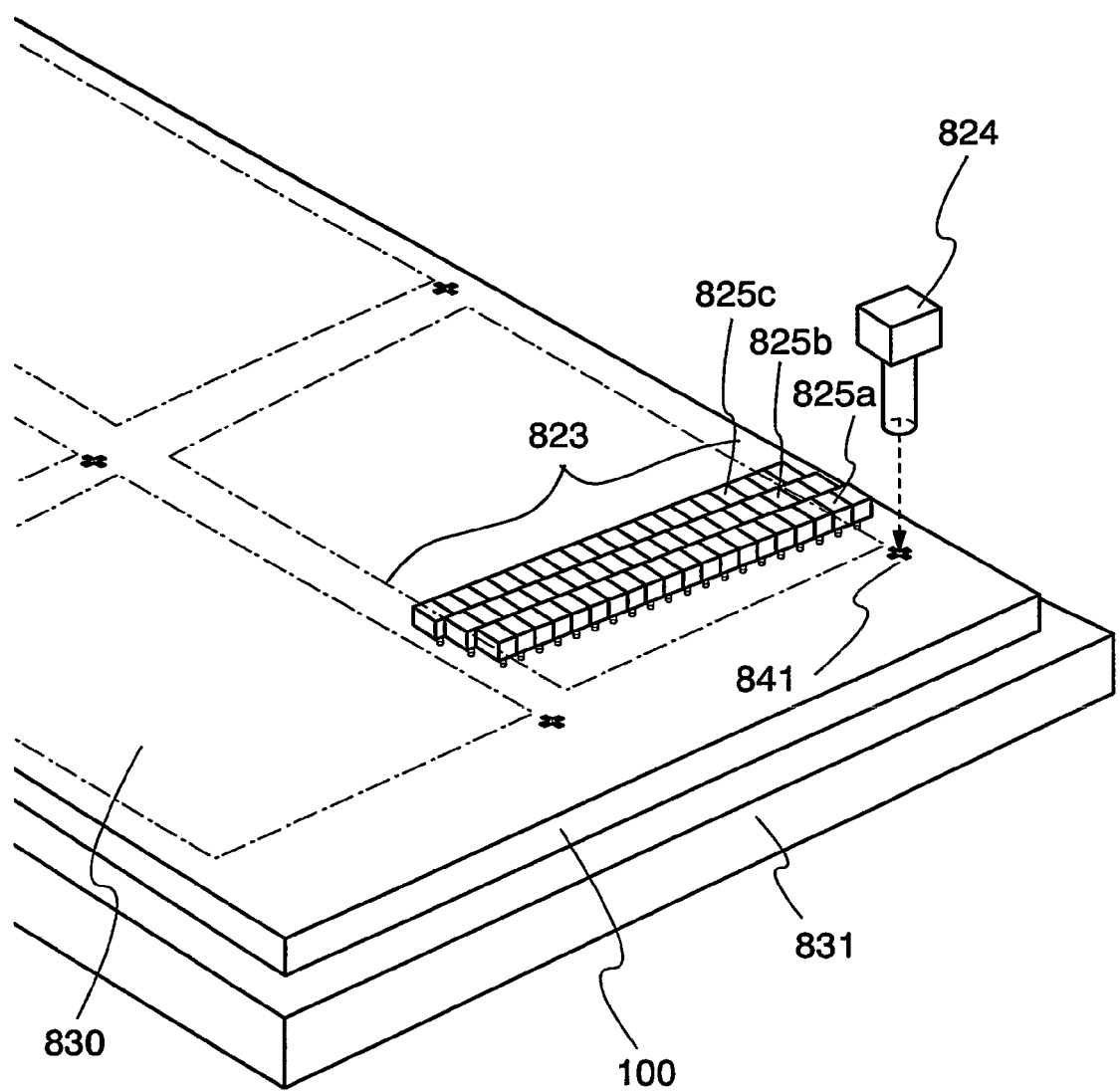
FIG. 26 shows a droplet discharge system of the present invention.

For example, as shown in FIG. 26, in the case of forming a plurality of panels from a large mother glass, the width of the whole droplet discharge means 823 may be equivalent to the width of the panel. In FIG. 26, the droplet discharge means 823 is arranged perpendicularly to the scan direction to form three lines.

In FIG. 26, an area 830 on the large substrate 100 where one panel is to be formed is shown by dotted lines. The droplet discharge means 823 includes heads 825*a*, 825*b*, and 825*c* with the same width as a panel. A pattern is formed by zig-zagging or reciprocating the droplet discharge means 823. Here, the head and the substrate may be relatively scanned more than once. Since other structures are similar to FIG. 18, the description will be omitted.

In FIG. 26, the heads 825*a*, 825*b*, and 825*c* may respectively contain materials for forming different layers, or may contain one material. When one material is discharged from the three heads to form an interlayer insulating film by patterning, the throughput is improved.

Embodiment Mode 14

Examples of electronic devices using a display device described in the above embodiment modes can be given as follows: a video camera; a digital camera; a goggle type display (head mounted display); a navigation system; an audio reproducing device (car audio, an audio component, or the like); a laptop personal computer; a game machine; a personal digital assistance (a mobile computer, a cellular phone, a portable game machine, an electronic book, or the like); an image reproducing device including a recording medium (specifically, a device capable of reproducing a recording medium such as a Digital Versatile Disc (DVD) and having a display that can display the image of the data); and the like. Specifically, an ink-jet method described in the above embodiment modes is preferably employed for a large television having a large screen or the like. Practical examples of these electronic devices are shown in FIGS. 19A and 19B.

Figure 19A:
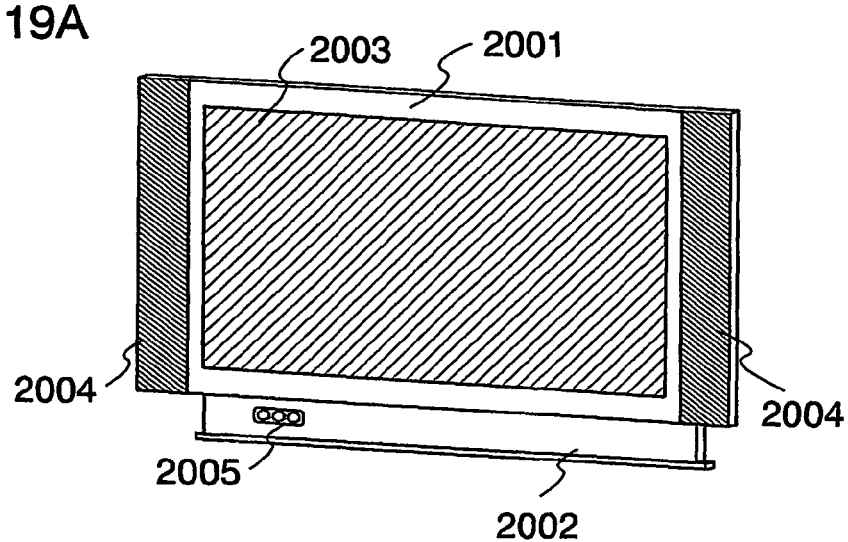
FIGS. 19A and 19B each show a television receiver of the present invention.

FIG. 19A shows a large EL display device, which includes a chassis 2001, a support 2002, a display portion 2003, a speaker unit 2004, a video signal input terminal 2005, and the like. The display portion 2003 is provided with a module including a pixel portion and a driver circuit portion. The pixel portion has a light emitting element and a TFT formed by ink-jet described in the above embodiment mode. Note that the display device includes all display devices for displaying information, including ones for personal computers, for TV broadcasting reception, and for advertisement.

It is preferable to provide a polarizing plate or a circularly polarizing plate for a pixel portion in order to improve contrast. For example, a sealing substrate is provided with a quarter-wave plate, a half-wave plate, and a polarizing plate in order. Further, an anti-reflective film may be provided over the polarizing plate.

Figure 19B:
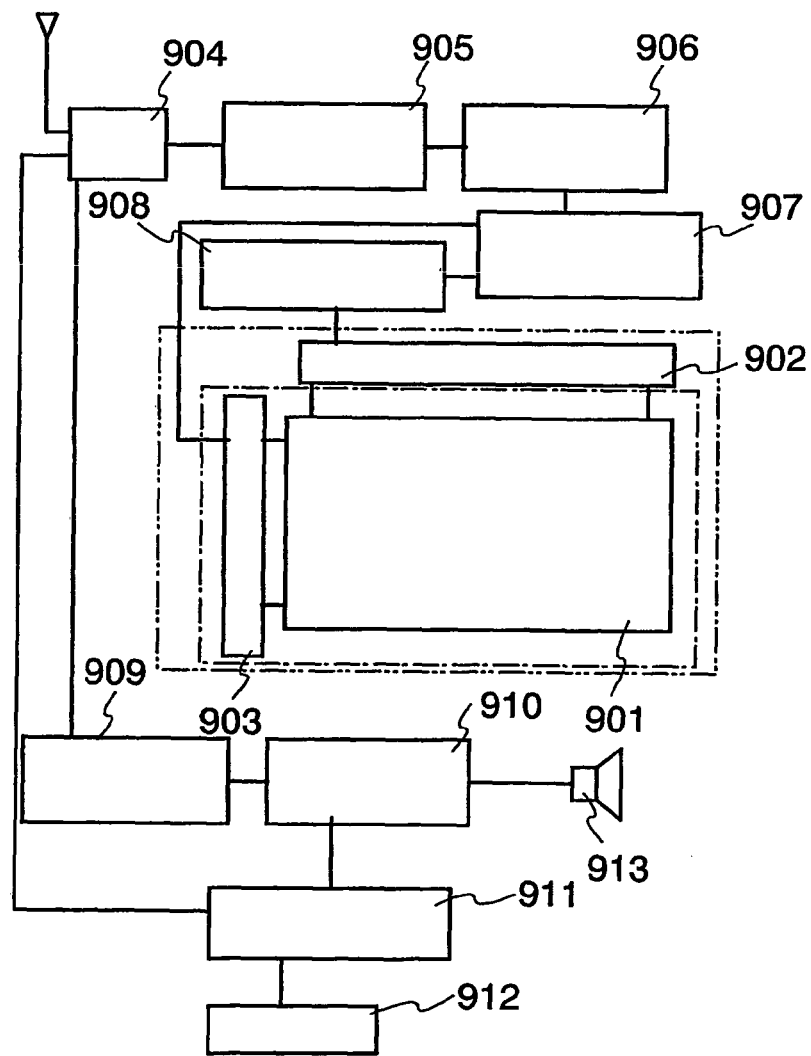

FIG. 19B shows a block diagram of a main structure of the EL television receiver. A pixel portion 901 having a structure shown in the above embodiment mode is formed in a display panel. For example, there is the case where a scan line driver circuit 903 and a signal line driver circuit 902 are mounted by a TAB method. As another case, the scan line driver circuit 903 and the signal line driver circuit 902 are mounted on the periphery of the pixel portion by a COG method. As still another case, a TFT is formed from a SAS, and the signal line driver circuit 902 is separately mounted as a driver IC by integrally forming the pixel portion 901 and the scan line driver circuit 903 over a substrate.

As a structure of an external circuit, in a side where a video signal is inputted, a signal received by a tuner 904 includes a video wave amplifier circuit 905 that amplifies a video signal; a video signal processing circuit 906 that converts signal outputted therefrom into a color signal corresponding to each color of red, green, and blue; a control circuit 907 for converting the video signal into an input specification of a driver IC; or the like. Signals are outputted to the scan line driver circuit and the signal line driver circuit from the control circuit 907. In the case of digital driving, a signal division circuit 908 is provided between the control circuit and the signal line driver circuit and may have a structure in which an input digital signal is provided by dividing into m-pieces.

Among signals received from the tuner 904, an audio signal is transmitted to an audio signal amplifier circuit 909, and the output thereof is supplied to a speaker 913 through an audio signal processing circuit 910. A control circuit 911 receives control information of a receiving station (a receiving frequency) or sound volume from an input portion 912 and transmits a signal to the tuner 904 or the audio signal processing circuit 910.

The television receiver can be completed by incorporating a display portion including such an external circuit into a chassis 2001. A speaker unit 2004, a video signal input terminal 2005, operation switches, and the like are provided as other attached equipment. Accordingly, the EL television receiver can be completed according to the present invention.

Of course, the invention is not limited to the television receiver and is applicable to a display medium with large area such as an information display board at a station, an airport, or the like, or an advertisement display board on the street as well as a monitor of a personal computer.

Figure 20A:
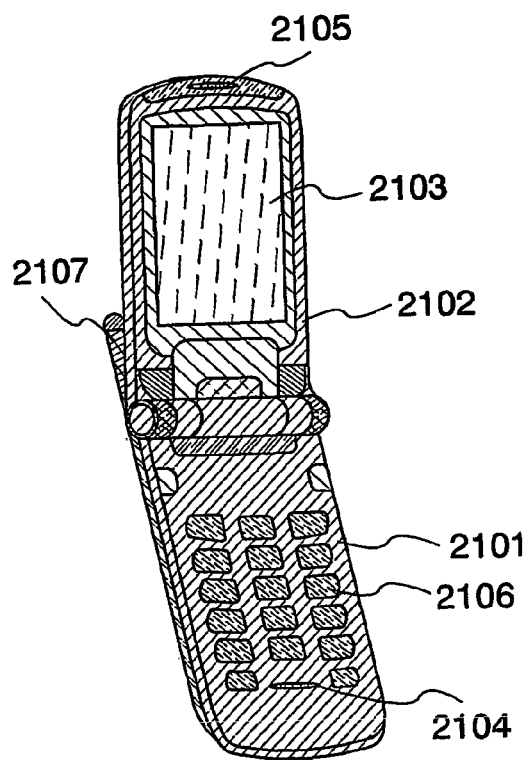
FIGS. 20A and 20B are views showing electronic devices of the present invention.

FIG. 20A shows a cellular phone that is one of personal digital assistants, which includes a main body 2101, a chassis 2102, a display portion 2103, an audio input portion 2104, an audio output unit 2105, operation keys 2106, an antenna 2107, and the like. The display portion 2103 is provided with a module including a pixel portion and a driver circuit portion. The pixel portion has a light emitting element and a TFT formed by ink-jet method described in the above embodiment modes. In addition, costs of the cellular phone can be reduced by forming the display portion 2103 by forming plural panels from one large mother glass substrate.

Figure 20B:
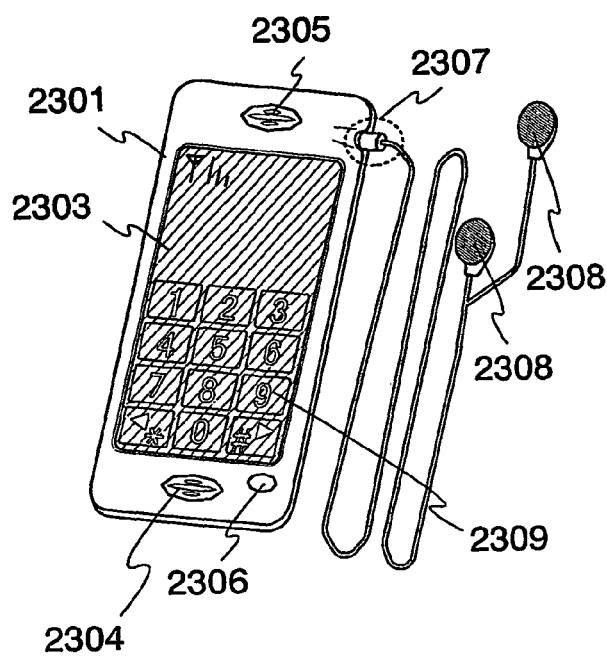

FIG. 20B shows a sheet-like cellular phone, which includes a main body 2301, a display portion 2303, an audio input portion 2304, an audio output portion 2305, a switch 2306, an external connection port 2307, and the like. A separately prepared earpiece 2308 can be connected to the cellular phone through the external connection port 2307. A touch panel display screen with a sensor is used for the display portion 2303. A series of operation can be performed by touching a touch panel operation key 2309 displayed on the display portion 2303. The display portion 2303 is provided with a module having a pixel portion and a driver circuit portion. The pixel portion has a light emitting element and a TFT formed by ink-jet described in the above embodiment modes. In addition, costs of the sheet-like cellular phone can be reduced by forming the display portion 2303 by forming plural panels from one large mother substrate.

Multiple panels of even such a compact electronic device can be fabricated using a large mother glass substrate by forming the display portion according to the invention. Thus, the costs can be reduced.

Figure 25A:
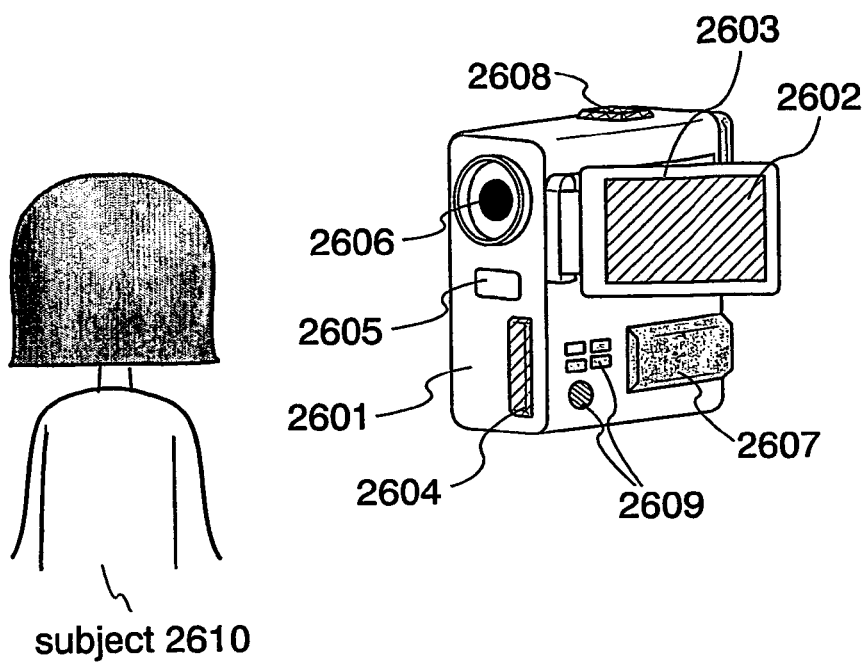
FIGS. 25A to 25C are views describing a digital video camera of the present invention.

FIG. 25A shows a digital video camera including a body 2601, a display area 2602, a chassis 2603, an external connection port 2604, a remote control receiving portion 2605, an image receiving portion 2606, a battery 2607, an audio input portion 2608, and operation keys 2609. The display portion 2602 is provided with a module including a pixel portion and a driver circuit portion. The pixel portion includes a light emitting element having a TFT formed by ink-jet according to the above embodiment modes. Further, a technology of dicing a large mother glass substrate is adopted to form the display portion 2602; thus, the costs of the digital video camera can be reduced.

In particular, in the case of shooting oneself using the digital video camera of this embodiment mode, the dual emission pixel portion is preferable. Since a dual emission pixel portion has translucency; thus, the image of oneself can be seen without flipping the chassis 2603.

Figure 25B:
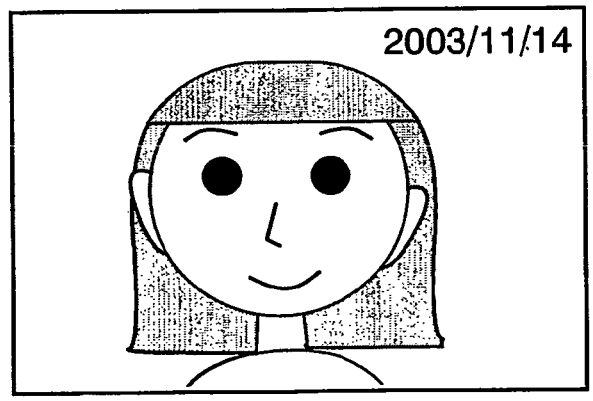
Figure 25C:
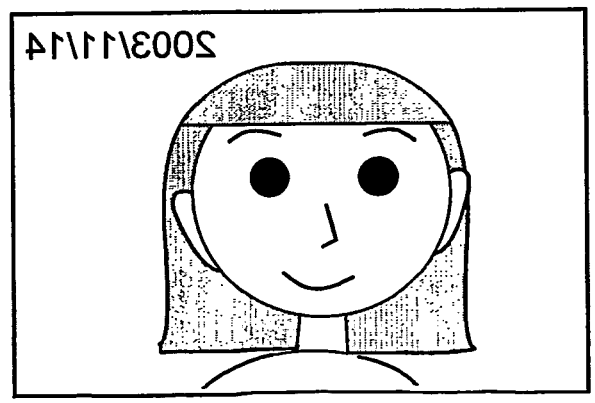

For example, when a subject 2610 shoots oneself, an image of the oneself can be displayed on the display portion 2602 without flipping the chassis 2603 as shown in FIG. 25B. Hereupon, the reverse image of FIG. 25B can be seen in the display portion 2602 from the other side of the subject as shown in FIG. 25C.

Further, in the case where a photographer shoots the subject 2610, the photographer and the subject 2610 can see the image on the display portion 2602 since the pixel has translucency. In this case, which of the photographer and the subject 2610 respectively see which one of the images in FIG. 25B and FIG. 25C can be selected.

As well as a digital video camera, for example, in the case of shooting oneself with a digital camera, an image of the oneself can be seen without flipping a chassis by installing a dual emission pixel portion. In this case, the chassis including a display portion is foldable as the digital video camera shown in FIG. 25A; thus, the main body of the digital camera can be separated from the chassis including a display area.

Also as to a digital camera, in the case where a photographer shoots the subject 2610, the dual emission pixel portion has translucency; thus, the photographer and the subject can see the image on the display portion 2602.

As described above, the application range of the invention is extremely wide, and the invention can be applied to any electronic devices in any field. Further, electronic devices according to this embodiment mode may have any structure shown in the above embodiment modes.

Embodiment 1

In this embodiment, the result of evaluating the adhesion of a conductive film in the case of forming a TiOx film as base pretreatment.

First, a Ti thin film (1 nm to 5 nm) is formed by sputtering and heated to form a TiOx film. The heat treatment uses an oven heated to 230° C. Thereafter, the sheet resistance of the TiOx film is measured. Then, the sheet resistance is not measurable since the resistance is $1\times10^6$ Ω/square or more; thus the TiOx film is confirmed to be insulative.

Thereafter, dots containing Ag are applied by ink-jet over the TiOx film to form 16 wirings of conductive films each having a length of 1 cm, a line width of 200 μM to 300 μm, and a height of 400 μm to 500 μm. Further, heat treatment is performed at 230° C.

The wirings are submitted to a tensile test. In the tensile test, a kapton tape is pasted on the wirings and whether the wirings are peeled or not in removal is evaluated. As a result, no wiring is peeled.

Further, the substrate where the wirings are formed as above is dipped in a 0.5% HF solution and water washing is carried out. As a result, the wirings are all left without being removed.

Meanwhile, in the case of forming wirings without forming a TiOx film, when the substrate is dipped in the 0.5% HF solution, most of the wirings are removed and only some of them remains.

When wirings are formed by spraying TiOx, the tensile test and the dipping experiment of the 0.5% HF solution are performed; however, the wirings are not removed.

Thus, it is found that the adhesion of wirings containing Ag is improved by base pretreatment.

This application is based on Japanese Patent Application serial no. 2003-386020 filed in Japan Patent Office on Nov. 14, 2003, the contents of which are hereby incorporated by reference.

The invention claimed is:

1. A display device comprising:
a substrate;
a first transistor including a first gate electrode which has a convex curved surface from an edge to an opposite edge, the first transistor being formed over the photocatalyst;
a second transistor including a second gate electrode which is connected to a first drain electrode of the first transistor, the second transistor being formed over the photocatalyst;
an insulating film provided so as to cover the first and the second transistors;
a first electrode which is connected to a second drain electrode of the second transistor;
an electroluminescent layer formed over the first electrode; and
a second electrode which is provided over the electroluminescent layer,
wherein the thickness of the first gate electrode decreases continuously from a center portion of the first gate electrode to an edge of the first gate electrode.

2. A display device comprising:
a substrate on which a photocatalyst is formed;
a first transistor including a first gate electrode which has a convex curved surface from an edge to an opposite edge, the first transistor being formed over the photocatalyst;
a second transistor including a second gate electrode which is connected to a first drain electrode of the first transistor, the second transistor being formed over the photocatalyst;
an insulating film provided so as to cover the first and the second transistors;
a first electrode which is connected to a second drain electrode of the second transistor;
an electroluminescent layer formed over the first electrode; and
a second electrode which is provided over the electroluminescent layer, wherein the thickness of the first gate electrode decreases continuously from a center portion of the first gate electrode to an edge of the first gate electrode.

3. A display device comprising:
a substrate on which a photocatalyst is formed;
a first transistor including a first gate electrode which has a convex curved surface from an edge to an opposite edge, the first transistor being formed over the photocatalyst;
a second transistor including a second gate electrode which is connected to a first drain electrode of the first transistor, the second transistor being formed over the photocatalyst;
a first insulating film provided so as to cover the first and the second transistors;
a second insulating film containing nitrogen which is formed so as to cover the first insulating film;
a first electrode which is connected to a second drain electrode of the second transistor;
an electroluminescent layer formed over the first electrode; and
a second electrode which is provided over the electroluminescent layer,
wherein the thickness of the first gate electrode decreases continuously from a center portion of the first gate electrode to an edge of the first gate electrode.

4. A display device comprising:
a substrate on which a photocatalyst is formed;
a first transistor including a first gate electrode which has a convex curved surface from an edge to an opposite edge, the first transistor being formed over the photocatalyst;
a second transistor including a second gate electrode which is connected to a first drain electrode of the first transistor, the second transistor being formed over the photocatalyst;
a first insulating film provided so as to cover the first and the second transistors;
a second insulating film containing nitrogen, which is formed so as to cover the first insulating film;
a first electrode which is connected to a second drain electrode of the second transistor;
an electroluminescent layer formed over the first electrode; and
a second electrode which is provided over the electroluminescent layer,
wherein the electroluminescent layer comprises an electron injection layer, an electron transport layer, a light emitting layer, a hole transport layer, and a hole injection layer,
wherein the thickness of the first gate electrode decreases continuously from a center portion of the first gate electrode to an edge of the first gate electrode.

5. A display device according to any one of claims 1 through 4,
wherein each of the first and the second gate electrodes is formed over an area treated with base pretreatment.

6. A display device according to claim 5,
wherein the base pretreatment is performed by using photocatalyst.

7. A display device according to any one of claims 1 through 4,
wherein the first and the second gate electrodes and the first and the second drain electrodes each contain gold, silver, copper, platinum, palladium, tungsten, nickel, tantalum, bismuth, lead, indium, tin, zinc, titanium or aluminum.

8. A display device according to any one of claims 1 through 4,
wherein the first electrode is connected to a second drain electrode of the second transistor by a columnar conductive film having a stacked structure.

9. A display device according to any one of claims 1 through 4,
wherein the first and the second transistor each include an amorphous semiconductor or a semiamorphous semiconductor.

10. A display device according to any one of claims 1 through 4, wherein a scan line is connected to the first gate electrode of the first transistor, a signal line is connected to the first drain electrode of the first transistor, and a protective circuit is provided for the scan line and the signal line.

11. A television receiver in which a display screen comprises a display device according to any one of claims 1 through 4.

12. A method for fabricating a display device, comprising the steps of:
forming a photocatalyst as a base film over a substrate;
forming a first conductive film by applying a first liquid composition containing a first conductor over the photocatalyst;
forming a semiconductor film over the first conductive film;
forming a second conductive film over the semiconductor film by applying a second liquid composition containing a second conductor, whereby a thin film transistor is formed;
forming a first insulating film so as to cover the thin film transistor;
forming a first electrode over the first insulating film;
forming a second insulating film so as to cover an end portion of the first electrode;
forming an electroluminescent layer over the first electrode; and
forming a second electrode so as to cover the electroluminescent layer,
wherein the thickness of the first conductive film decreases continuously from a center portion of the first conductive film to an edge of the first conductive film.

13. A method for fabricating a display device, comprising the steps of:
forming a photocatalyst as a base film over a substrate;
forming a first conductive film by a droplet discharge method over the photocatalyst;
forming a semiconductor film over the first conductive film;
forming a second conductive film over the semiconductor film by a droplet discharge method, whereby a thin film transistor is formed;
forming a first insulating film so as to cover the thin film transistor;
forming a first electrode over the first insulating film;
forming a second insulating film so as to cover an end portion of the first electrode;
forming an electroluminescent layer over the first electrode; and
forming a second electrode so as to cover the electroluminescent layer,
wherein the thickness of the first conductive film decreases continuously from a center portion of the first conductive film to an edge of the first conductive film.

14. A method for fabricating a display device according to any one of claims 12 and 13,
wherein the method further comprises a step of first base pretreatment to where the first conductive film is formed before forming the first conductive film.

15. A method for fabricating a display device according to claim 14,
wherein the first base pretreatment is performed by using photocatalyst.

16. A method for fabricating a display device according to any one of claims 12 and 13,
wherein the method further comprises a step of second base pretreatment to where the second conductive film is formed before forming the second conductive film.

17. A method for fabricating a display device according to claim 16,
wherein the second base pretreatment is performed by using photocatalyst.

18. A method for fabricating a display device, comprising the steps of:
forming a photocatalyst as a base film over a substrate;
forming a first and a second gate electrodes by a droplet discharge method;
forming a semiconductor film over the first and second gate electrodes;
forming a mask over the semiconductor film;
patterning the semiconductor film using the mask;
forming a first and a second source electrodes and a first and a second drain electrodes over the patterned semiconductor films by a droplet discharge method, whereby thin film transistors are formed;
forming a columnar conductive film over the second source electrode or the second drain electrode by discharging droplets containing a conductor on top of each other;
forming a first insulating film so as to cover a side portion of the columnar conductive film and the thin film transistors;
forming a first electrode so as to connect to the columnar conductive film over the first insulating film;
forming a second insulating film so as to cover an end portion of the first electrode;
forming an electroluminescent layer over the first electrode by a droplet discharge method; and
forming a second electrode so as to cover the electroluminescent layer,
wherein the thickness of the first gate electrode decreases continuously from a center portion of the first gate electrode to an edge of the first gate electrode.

19. A method for fabricating a display device, comprising the steps of:
forming a photocatalyst as a base film over a substrate;
forming a first and a second gate electrodes by a droplet discharge method;
forming a semiconductor film over the first and second gate electrodes;
forming a mask over the semiconductor film;
patterning the semiconductor film using the mask;
forming a first and a second source electrodes and a first and a second drain electrodes over the patterned semiconductor films by a droplet discharge method, whereby thin film transistors are formed;
forming a first insulating film so as to cover the thin film transistors;
forming a contact hole in the first insulating film over the second source electrode or the second drain electrode;
forming a columnar conductive film by discharging droplets containing a conductor on top of each other in the contact hole;
forming a first electrode so as to connect to the columnar conductive film;
forming a second insulating film so as to cover an end portion of the first electrode;
forming an electroluminescent layer over the first electrode by a droplet discharge method; and
forming a second electrode so as to cover the electroluminescent layer,
wherein the thickness of the first gate electrode decreases continuously from a center portion of the first gate electrode to an edge of the first gate electrode.

20. A method for fabricating a display device according to claim 19,
wherein the mask is formed over the first insulating film by a droplet discharge method, and
the contact hole is formed in the first insulating film by etching using the mask.

21. A method for fabricating a display device, comprising the steps of:
forming a photocatalyst as a base film over a substrate;
forming a first and a second gate electrodes by a droplet discharge method;
forming a semiconductor film over the first and second gate electrodes;
forming a mask over the semiconductor film;
patterning the semiconductor film using the mask;
forming a first and a second source electrodes and a first and a second drain electrodes over the patterned semiconductor films by a droplet discharge method, whereby thin film transistors are formed;
forming a first insulating film so as to form an opening over the second source electrode or the second drain electrode;
forming a first electrode in the opening of the first insulating film;
forming a second insulating film so as to cover a part of the first electrode;
forming an electroluminescent layer over the first electrode by a droplet discharge method; and
forming a second electrode so as to cover the electroluminescent layer,
wherein the thickness of the first gate electrode decreases continuously from a center portion of the first gate electrode to an edge of the first gate electrode.

22. A method for fabricating a display device, comprising the steps of:
forming a photocatalyst as a base film over a substrate;
forming a first and a second gate electrodes by a droplet discharge method;
forming a semiconductor film over the first and second gate electrodes;
forming a mask over the semiconductor film;
patterning the semiconductor film using the mask;
forming a first and a second source electrodes and a first and a second drain electrodes over the patterned semiconductor films by a droplet discharge method, whereby thin film transistors are formed;
forming a columnar organic film over the second source electrode or the second drain electrode;
forming a first insulating film so as to cover the columnar organic film and the thin film transistors;

removing the columnar organic film;
forming a first electrode so as to connect to the second source electrode or the second drain electrode over the first insulating film;
forming a second insulating film so as to cover an end portion of the first electrode;
forming an electroluminescent layer over the first electrode by a droplet discharge method; and
forming a second electrode so as to cover the electroluminescent layer,
wherein the thickness of the first gate electrode decreases continuously from a center portion of the first gate electrode to an edge of the first gate electrode.

23. A method for fabricating a display device according to claim 22,
wherein the first insulating film is repellent to the columnar organic film.

24. A method for fabricating a display device according to claim 22,
wherein the columnar organic film is removed by water washing.

25. A method for fabricating a display device, comprising the steps of:
forming a photocatalyst as a base film over a substrate;
forming a first and a second gate electrodes by a droplet discharge method;
forming a semiconductor film over the first and second gate electrodes;
forming a first mask over the semiconductor film;
patterning the semiconductor film using the first mask;
forming a first and a second source electrodes and a first and a second drain electrodes over the patterned semiconductor films by a droplet discharge method, whereby a first and a second thin film transistor are formed;
forming an organic film which is repellent to a first insulating film on a surface of the second thin film transistor;
forming a second mask over a part of the second source electrode or the second drain electrode;
removing the organic film using the second mask;
forming the first insulating film;
forming an opening over the part of the second source electrode or the second drain electrode by removing the second mask;
forming a first electrode in the opening so as to connect to the second source electrode or the second drain electrode;
forming a second insulating film so as to cover a part of the first electrode;
forming an electroluminescent layer over the first electrode by a droplet discharge method; and
forming a second electrode so as to cover the electroluminescent layer,
wherein the thickness of the first gate electrode decreases continuously from a center portion of the first gate electrode to an edge of the first gate electrode.

26. A method for fabricating a display device according to any one of claims 18, 19, 21, 22 and 25,
wherein the method further comprises a step of first base pretreatment to where the first and the second gate electrodes are formed before forming the first and second gate electrodes.

27. A method for fabricating a display device according to claim 26,
wherein the first base pretreatment is performed by using photocatalyst.

28. A method for fabricating a display device according to any one of claims 18, 19, 21, 22 and 25,
wherein the method further comprises a step of second base pretreatment to where the first and the second source electrodes and the first and the second drain electrodes are formed before forming the first and the second source electrodes and the first and the second drain electrodes.

29. A method for fabricating a display device according to claim 28,
wherein the second base pretreatment is performed by using photocatalyst.

30. A method for fabricating a display device according to any one of claims 18, 19, 21, 22 and 25,
wherein channel protective films are formed in contact with the semiconductor film over the first and the second gate electrode.

31. A method for fabricating a display device, comprising the steps of:
forming a photocatalyst as a base film over a substrate;
forming a first and a second source electrodes and a first and a second drain electrodes by a droplet discharge method;
forming a semiconductor film over the first and the second source electrodes and the first and the second drain electrodes;
forming a mask over the semiconductor film;
patterning the semiconductor film using the mask;
forming a first and a second gate electrode over the patterned semiconductor films by a droplet discharge method, whereby thin film transistors are formed;
forming a columnar conductive film over the second source electrode or the second drain electrode;
forming a first insulating film so as to cover a side portion of the columnar conductive film and the thin film transistors;
forming a first electrode so as to connect to the columnar conductive film over the first insulating film;
forming a second insulating film so as to cover an end portion of the first electrode;
forming an electroluminescent layer over the first electrode by a droplet discharge method; and
forming a second electrode so as to cover the electroluminescent layer,
wherein the thickness of the first source electrode decreases continuously from a center portion of the first source electrode to an edge of the first source electrode.

32. A method for fabricating a display device according to claim 31,
wherein the method further comprises a step of first base pretreatment to where the first and the second source electrodes and the first and the second drain electrodes are formed before forming the first and the second source electrodes and the first and the second drain electrodes.

33. A method for fabricating a display device according to claim 32,
wherein the first base pretreatment is performed by using photocatalyst.

34. A method for fabricating a display device according to claim 31,
wherein the method further comprises a step of second base pretreatment to where the first and the second gate electrodes are formed before forming the first and the second gate electrodes.

35. A method for fabricating a display device according to claim 34,
wherein the second base pretreatment is performed by using photocatalyst.

36. A method for fabricating a display device, comprising the steps of:
- forming a photocatalyst as a base film over a substrate;
- forming a first and a second gate electrodes of a first and a second transistors by a droplet discharge method;
- forming a semiconductor film over the first and the second gate electrodes with a gate insulating film therebetween;
- forming a first and a second source electrodes and a first and a second drain electrodes of the first and the second transistors by a droplet discharge method over the semiconductor film;
- forming a contact hole for connecting the first source electrode or the first drain electrode of the first transistor to the second gate electrode of the second transistor by etching the gate insulating film;
- forming a conductive film in the contact hole by a droplet discharge method, whereby thin film transistors are formed;
- forming a columnar conductive film over the second source electrode or the second drain electrode of the second transistor;
- forming a first insulating film so as to cover a side portion of the columnar conductive film and the first and the second thin film transistors;
- forming a first electrode so as to connect to the columnar conductive film over the first insulating film;
- forming a second insulating film so as to cover an end portion of the first electrode;
- forming an electroluminescent layer over the first electrode; and
- forming a second electrode so as to cover the electroluminescent layer,
- wherein the thickness of the first gate electrode decreases continuously from a center portion of the first gate electrode to an edge of the first gate electrode.

37. A method for fabricating a display device according to any one of claims 12, 13, and 36,
- wherein the electroluminescent layer is formed by a droplet discharge method.

38. A method for fabricating a display device, comprising the steps of:
- forming a photocatalyst as a base film over a substrate;
- forming a first and a second gate electrodes of a first and a second transistors by a droplet discharge method;
- forming a semiconductor film over the first and the second gate electrodes with a gate insulating film therebetween;
- patterning the semiconductor film;
- forming a first and a second source electrodes and a first and a second drain electrodes of the first and the second transistors by a droplet discharge method over the patterned semiconductor films;
- forming a contact hole for connecting the first source electrode or the first drain electrode of the first transistor to the second gate electrode of the second transistor by etching the gate insulating film using any of the source electrodes and the drain electrodes;
- forming a conductive film in the contact hole by a droplet discharge method, whereby thin film transistors are formed;
- forming a columnar conductive film over the second source electrode or the second drain electrode of the second transistor;
- forming a first insulating film by a droplet discharge method so as to cover a side portion of the columnar conductive film and the first and the second thin film transistors;
- forming a first electrode so as to connect to the columnar conductive film over the first insulating film;
- forming a second insulating film so as to cover an end portion of the first electrode;
- forming an electroluminescent layer over the first electrode by a droplet discharge method; and
- forming a second electrode so as to cover the electroluminescent layer,
- wherein the thickness of the first gate electrode decreases continuously from a center portion of the first gate electrode to an edge of the first gate electrode.

39. A method for fabricating a display device according to any one of claims 36 and 38,
- wherein the method further comprises a step of first base pretreatment to where the gate electrodes of the first and the second transistors are formed before forming the gate electrodes of the first and the second transistors.

40. A method for fabricating a display device according to claim 39,
- wherein the first base pretreatment is performed by using photocatalyst.

41. A method for fabricating a display device according to any one of claims 36 and 38,
- wherein the method further comprises a step of second base pretreatment to where the first and the second source electrodes and the first and the second drain electrodes of the first and the second transistors are formed before forming the first and the second source electrodes and the first and the second drain electrodes of the first and the second transistors.

42. A method for fabricating a display device according to claim 41,
- wherein the second base pretreatment is performed by using photocatalyst.

43. A method for fabricating a display device according to any one of claims 12, 13, 18, 19, 21, 22, 25, 31, 36 and 38,
- wherein a surface of the first insulating film is planarized by spraying a gas.

44. A method for fabricating a display device, comprising the steps of:
- preparing a treatment system including a first treatment chamber for droplet discharge and a second treatment chamber for planarization;
- forming a columnar conductive film having side portions covered with an insulating film over an object by a droplet discharge method in the first treatment chamber;
- transferring the object into the second treatment chamber without exposure to the atmosphere; and
- planarizing a top surface of the columnar conductive film and the insulating film in the second treatment chamber by a means for spraying a gas.

45. A method for fabricating a display device according to claim 44,
- wherein each of the conductive film and the insulating film is formed over an area of the object treated with base pretreatment.

46. A method for fabricating a display device according to claim 45,
- wherein the base pretreatment is performed by using photocatalyst.

47. A method for fabricating a display device according to any one of claims 13, 18, 19, 20, 21, 22, 25, 31, 36, 38 and 44,
- wherein ink-jet is used for the droplet discharge method.

* * * * *